US012707731B2

(12) United States Patent
Ciocys et al.

(10) Patent No.: US 12,707,731 B2
(45) Date of Patent: Aug. 11, 2026

(54) LIGHT-DRIVEN ULTRAFAST ELECTRIC GATING

(71) Applicant: THE REGENTS OF THE UNIVERSITY OF CALIFORNIA, Oakland, CA (US)

(72) Inventors: Samuel Ciocys, Berkeley, CA (US); Alessandra Lanzara, Piedmont, CA (US)

(73) Assignee: THE REGENTS OF THE UNIVERSITY OF CALIFORNIA, Oakland, CA (US)

( * ) Notice: Subject to any disclaimer, the term of this patent is extended or adjusted under 35 U.S.C. 154(b) by 829 days.

(21) Appl. No.: 17/930,760

(22) Filed: Sep. 9, 2022

(65) Prior Publication Data

US 2023/0110264 A1 Apr. 13, 2023

Related U.S. Application Data

(60) Provisional application No. 63/242,392, filed on Sep. 9, 2021.

(51) Int. Cl.
*H10F 30/28* (2025.01)
*H03K 17/56* (2006.01)
(Continued)

(52) U.S. Cl.
CPC ............ *H10F 30/28* (2025.01); *H03K 17/56* (2013.01); *H10F 30/2823* (2025.01);
(Continued)

(58) Field of Classification Search
CPC .... H10F 30/28; H10F 30/2823; H10F 77/143; H10F 77/12; H10F 77/122; H10F 10/16; H03K 17/56
See application file for complete search history.

(56) References Cited

U.S. PATENT DOCUMENTS

2005/0056867 A1* 3/2005 Nauka .................. G01N 27/002 257/222
2009/0290150 A1* 11/2009 Takimoto ............... G01N 21/65 356/301
(Continued)

OTHER PUBLICATIONS

Ciocys, Samuel T. et al., "Driving ultrafast spin and energy modulation in quantum well states via photo-induced electric fields," NPJ Quantum Materials, 79, 2022, pp. 1-10.
(Continued)

*Primary Examiner* — Sitaramarao S Yechuri
(74) *Attorney, Agent, or Firm* — O'BANION & RITCHEY LLP; John P. O'Banion

(57) ABSTRACT

A source and drain electrode are spaced apart by an optically exposed gate region above a surface photovoltage effect (SPV) bulk. A two-dimensional material is deposited upon the gate region. The gate region is activated by exposure to an ultrafast light pulse, which may be infrared or near-infrared, and may be a focused collimated laser pulse with a sub-picosecond width. The pulse causes electron-hole pair generation resulting in band bending in the SPV material, which generates an electric field within the 2D material, thereby modifying the electronic properties between source and drain via a field-effect. After passage of the pulse, conduction continues in the device until the conductive electron-hole pairs recombine during the SPV decay time. The two-dimensional material may comprise a crystalline atomic monolayer. The activation is repeatable with subsequent pulses, resulting in the device cycling on and off within timescales less than 200 picoseconds.

18 Claims, 16 Drawing Sheets

(51) Int. Cl.
*H10F 77/14* (2025.01)
*H10F 10/16* (2025.01)
*H10F 77/12* (2025.01)
*H10F 77/122* (2025.01)

(52) U.S. Cl.
CPC ........... *H10F 77/143* (2025.01); *H10F 10/16* (2025.01); *H10F 77/12* (2025.01); *H10F 77/122* (2025.01)

(56) References Cited

U.S. PATENT DOCUMENTS

| | | | | |
|---|---|---|---|---|
| 2015/0243826 | A1* | 8/2015 | An | H10F 30/28 438/57 |
| 2020/0194602 | A1* | 6/2020 | Choi | H10D 30/475 |
| 2022/0102570 | A1* | 3/2022 | Bessonov | H10F 30/2877 |

OTHER PUBLICATIONS

King, Philip D. C. et al., "Large tunable Rashba spin splitting of a two-dimensional electron gas in Bi2Se3", Phys. Rev. Lett. 107, Aug. 26, 2011, pp. 1-5.

Benia, Hadji et al., "Reactive chemical doping of the Bi2Se3 topological insulator" Phys. Rev. Lett. 107, May 13, 2011, pp. 1-4.

Bianchi, Marco et al., "Simultaneous quantization of bulk conduction and valence states through adsorption of nonmagnetic impurities on Bi2Se3", Phys. Rev. Lett. 107, May 19, 2011, pp. 1-5.

Datta, Supriyo et al., "Electronic analog of the electro-optic modulator", Appl. Phys. Lett. 56, Issue 7, Feb. 1990, pp. 665-667.

Wang, Te-Hsien et al., "Wide-range ideal 2D Rashba electron gas with large spin splitting in Bi2Se3/MoTe2 heterostructure", npj Comput. Mater 3, 2017, pp. 1-6.

Chen, Chaoyu et al. "Robustness of topological order and formation of quantum well states in topological insulators exposed to ambient environment" Proc. Natl. Acad. Sci. 109, Chen, C. et al. Robustness of topological order and formation of quantum well states in topological insulators exposed to ambient environment. Proc. Natl. Acad. Sci. 109, Mar. 6, 2012, pp. 3694-3698.

Papalazarou, E. et al. "Unraveling the Dirac fermion dynamics of the bulk-insulating topological system Bi2Te2Se", Phys. Rev. Mater. 2, 2018, pp. 1-13.

Yoshikawa, T. et al. "Bidirectional surface photovoltage on a topological insulator", Phys. Rev. B 100, 165311, 2019, pp. 1-6.

Ishida, Y. et al., "Emergent photovoltage on SmB6 surface upon bulk-gap evolution revealed by pump-and-probe photoemission spectroscopy" Sci. Rep. 5, 8160, Jul. 23, 2015, pp. 1-6.

Ciocys, Samuel et al., "Manipulating long-lived topological surface photovoltage in bulkinsulating topological insulators Bi2Se3 and Bi2Te3". npj Quantum Mater. 5, 2020, pp. 1-7.

Neupane, Madhab et al., "Gigantic surface lifetime of an intrinsic topological insulator", Phys. Rev. Lett. 115, 116801, 2015, pp. 1-5.

Zhu, Z.-H. et al., "Rashba spin-splitting control at the surface of the topological insulator Bi2Se3", Phys. Rev. Lett. 107, Jun. 3, 2011, pp. 1-5.

Bianchi, Marco et al. "Robust surface doping of Bi2Se3 by Rubidium intercalation" ACS Nano 6, Jul. 27, 2012, pp. 7009-7015.

Wray, L. A. et al. "A topological insulator surface under strong Coulomb, magnetic and disorder perturbations", Nat. Phys. 7, Jan. 2011, pp. 32-27.

Valla, T. et al., "Photoemission spectroscopy of magnetic and nonmagnetic impurities on the surface of the Bi2Se3 topological insulator", Phys. Rev. Lett. 108, 2012 pp. 1-6.

Zhang, Z. et al., "Band bending in semiconductors: chemical and physical consequences at surfaces and interfaces", Chem. Rev. 112, 5520-5551 (2012).

* cited by examiner

1800

$E_F^* - E_F$ (meV)

μJ/cm²

2. 3. 6. 11. 19. 52. 59.

1804

$\tau_{cross}$

1802

Delay (ps)

$\Delta n_{surf}$ (norm.)

QW1+QW2

1902

QW1

QW2

Fluence (μJ/cm²)

LIGHT-DRIVEN ULTRAFAST ELECTRIC GATING

CROSS-REFERENCE TO RELATED APPLICATIONS

This application claims priority to, and the benefit of, U.S. provisional patent application Ser. No. 63/242,392 filed on Sep. 9, 2021, incorporated herein by reference in its entirety.

STATEMENT REGARDING FEDERALLY SPONSORED RESEARCH OR DEVELOPMENT

This invention was made with government support under Contract No. DE-AC02-05CH11231 awarded by the U.S. Department of Energy. The Government has certain rights in the invention.

NOTICE OF MATERIAL SUBJECT TO COPYRIGHT PROTECTION

A portion of the material in this patent document may be subject to copyright protection under the copyright laws of the United States and of other countries. The owner of the copyright rights has no objection to the facsimile reproduction by anyone of the patent document or the patent disclosure, as it appears in the United States Patent and Trademark Office publicly available file or records, but otherwise reserves all copyright rights whatsoever. The copyright owner does not hereby waive any of its rights to have this patent document maintained in secrecy, including without limitation its rights pursuant to 37 C.F.R. § 1.14.

BACKGROUND

1. Technical Field

The technology of this disclosure pertains generally to electric field gating, and more particularly to ultrafast light induced back-gating by leveraging the surface band bending inherent to many semiconductor materials.

2. Background Discussion

Electric field gating is one of the most fundamental tuning variables for all modern solid-state technology and is the foundation for many solid-state devices such as transistors. The future of modern optoelectronics and spintronic devices relies on the ability to control the spin and charge degrees of freedom at ultrafast timescales. Rashba spin-split quantum well states, 2D states that develop at the surface of strong spin-orbit coupling materials, are ideal given the tunability of their energy and spin states. So far however, most studies have only demonstrated such control in a static manner. Current methods for in-situ back-gated devices are difficult to fabricate, introduce unwanted contaminants, and are unsuited for picosecond time-resolved electric field studies.

BRIEF SUMMARY

This application discloses a new way to generate ultrafast back-gating by leveraging the surface band bending inherent to many semiconductor materials. In one embodiment, a new architecture comprising a standard bulk semiconductor material and a layered material on the surface is presented. Optical pulses generate picosecond time varying electric fields on the surface material. This method has been successfully applied to a quantum well Rashba system, as the Rashba system is considered today one of the most promising candidates for spin-based devices, such as the Datta Das spin-transistor. It is shown here that one can induce an ultrafast gate and drive time dependent Rashba and quantum well dynamics never observed before, with switching times faster than 10 GHz. This approach minimizes lithography and can enable light-driven electronic and spintronics devices such as transistors, spin-transistors and photo-controlled Rashba circuitry. This method can be applied with minimal effort to any two-dimensional material, for both exfoliated and molecular beam epitaxy grown samples.

In this disclosure it is demonstrated that one may control of the spin and energy degrees of freedom of surface quantum well states on Bi2Se3 at picosecond timescales. By means of a focused laser pulse, the band-bending is modulated, producing picosecond time-varying electric fields at the material's surface, thereby reversibly modulating the quantum well spectrum and Rashba effect. Moreover, a dynamic quasi-Fermi level is uncovered, dependent on the Lifshitz transition of the second quantum well band bottom. These results open a pathway for light-driven spintronic devices with ultrafast switching of electronic phases and offer the interesting prospect to extend this ultrafast photo-gating technique to a broader host of 2D materials.

Typical gating geometries require a physical back-gate which requires lithography steps as well as an additional electrode to supply the voltage. The method described here sets a determined location for the region of gating and, for ultrafast applications, requires careful consideration of the AC characteristics of the gate voltage wiring to ensure proper ultrafast gate operation. Such method removes the need for a lithographed back-gate. The gate is the substrate material itself, in which many semiconductor materials already used in typical semiconductor processing may serve as suitable SPV substrate candidates. Since the gate is operated with focused laser light, the geometry, location, and timing of the gating region is flexible, allowing for complex operations across an integrated wafer without intricate arrangements of gating structures. Moreover, the light-driven aspect of the gating method enables novel device creation for applications that combine photonic and electronic processes.

This gating technique can enable development of ultrafast gated two-dimensional material devices as well as photo-electronic components, and can serve as a clean method to explore and test material properties under ultrafast external fields. Examples of device applications include, but are not limited to, phototransistors, spin-transistors/spin-current filters, photodetection, and solar cells.

Further aspects of the technology described herein will be brought out in the following portions of the specification, wherein the detailed description is for the purpose of fully disclosing preferred embodiments of the technology without placing limitations thereon.

BRIEF DESCRIPTION OF THE DRAWINGS

The technology described herein will be more fully understood by reference to the following drawings which are for illustrative purposes only.

DETAILED DESCRIPTION

A. General Embodiments

Figure 1:
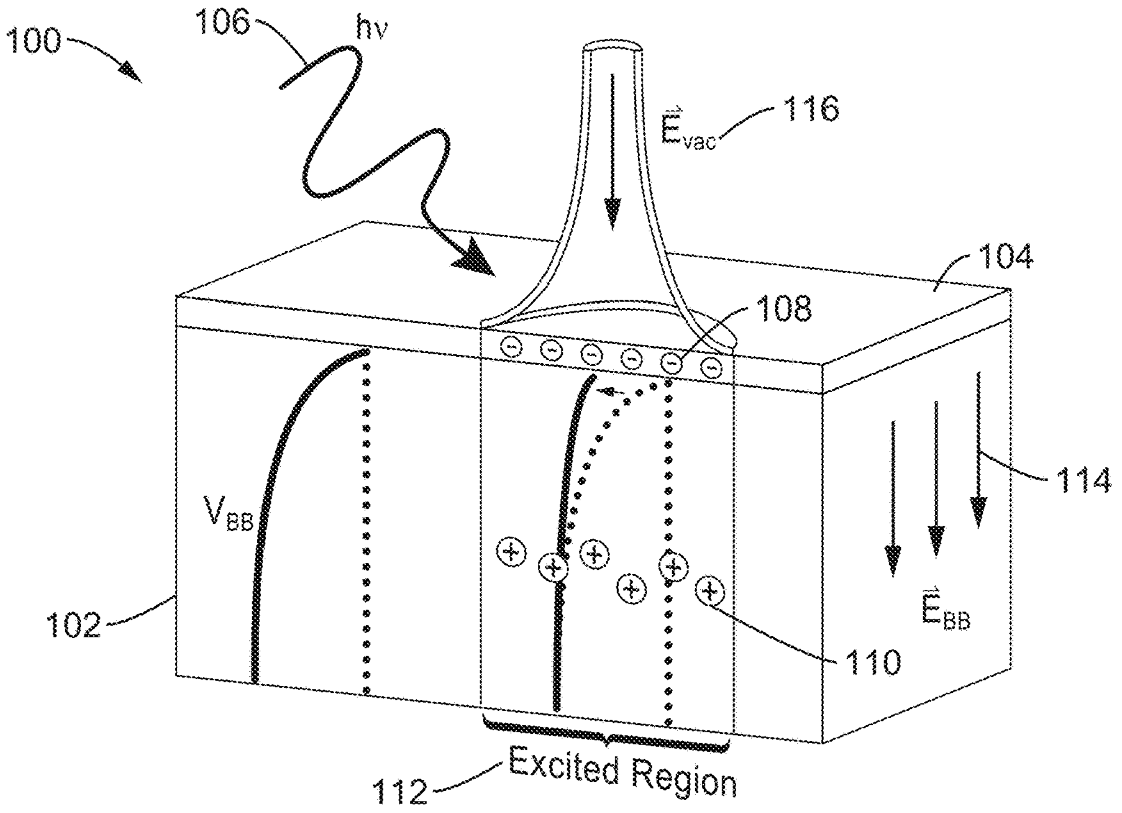
FIG. 1 is a perspective diagram of the band-bending in $Bi_2Se_3$ inside and outside of an illuminated region. Infrared excitation generates excited electron-hole pairs that are separated by the band-bending, reducing the internal electric field.

Typical gating geometries require a physical back-gate which in turn requires lithography steps for fabrication as well as an additional electrode to supply the voltage. Such geometries set determined location for the region of gating and, for ultrafast applications, require careful consideration of the AC characteristics of the gate voltage wiring to ensure proper ultrafast gate operation.

In contrast, a method is described here that removes the need for a lithographed back-gate. In this device, the gate is the substrate material itself. As a result, many semiconductor materials already used in typical semiconductor processing can serve as suitable substrate candidates. Furthermore, in this device the gate is operated with focused laser light, the geometry, location, and timing of the gating region is flexible, allowing for complex operations across an integrated wafer without intricate arrangements of gating structures. Moreover, the light-driven aspect of this gating method enables novel device creation for applications that combine photonic and electronic processes.

The light-driven ultrafast electric gate described here operates on the principle of the surface photovoltage effect (SPV). The SPV effect occurs in many semiconductors, where a difference in electronic states at the surface versus the bulk leads to a redistribution of charge at the surface. This non-uniform charge distribution produces an internal electric field at equilibrium (also known as surface band-bending). Illumination of the surface with photons of higher energy than the bulk band gap generates electron hole pairs that cancel the internal field. This drives a change in the electric potential at the surface, producing an electric field outside the material. The electric field strength is dependent on the photon flux and surface band-bending. The latter can be tuned in semiconductor materials through differential bulk and surface doping and material choice.

The device described here takes this principle even further by utilizing ultrafast (sub picosecond) infrared pulses. Ultrafast pulses generate electron-hole pairs during the duration of the pulse, inducing a step-like change in the electric potential at the surface. The resulting external electric field decays according to the electron-hole recombination rate of the semiconductor. This recombination rate is typically on the order of hundreds of picoseconds, but can be tuned by chemical doping or material choice for a wide range of electric field lifetimes.

Finally, to apply the ultrafast electric gate, a 2D material is joined to the semiconductor surface. This can be accomplished with or without an insulating buffer layer, such as hexagonal boron nitride (hBN), depending on whether the application needs electronic isolation from the semiconductor substrate. Through molecular beam epitaxy (MBE), 2D materials can be grown on the surface of the semiconductor. Additionally, exfoliated 2D materials of interest can be directly placed on the surface to be gated. With this method, no lithography is needed to create the electric back gate since the gate is driven with a focused laser pulse. The large penetration depth of the laser pulse ensures that the photons will reach the substrate to operate the gate. This method has two novel advantages over existing technologies. Firstly, the gate is light-driven. This means that the wiring needed for typical voltage driven gates can be removed, reducing the number of lithography steps required in device fabrication as well as simpler wiring diagrams in integrated devices. Secondly, the device operates at ultrafast speeds (>10 GHz). Because the gate is driven by ultrafast light pulses, it is very simple to trigger measurements and device outputs to the output of the light source. This enables ultrafast gating experiments as well as precision device synchronization.

Studies on the SPV effect in bulk-insulating bismuth-selenide have led to the realization of an ultrafast gating application. Through time-resolved angle-resolved photoemission spectroscopy (tr-ARPES), it has been discovered that ultrafast infrared pulses generate a large external electric field (>100 mV) in bismuth-selenide due to the SPV effect with tunable lifetimes (100 picoseconds to 10 nanoseconds). To prove this concept of the light-driven ultrafast electric gate, 2D quantum well Rashba states at the surface were produced through surface treatment of bulk-insulating bismuth selenide crystals. Both the quantum well spectrum and the Rashba spin splitting of the quantum well dispersions are affected by external electric fields, serving as an ideal testbed for the device operation. Successful demonstrations of never-before-observed ultrafast modifications of the quantum well spectrum as well as an ultrafast reduction of the Rashba spin-splitting correlated with the SPV electric field have been observed. Accordingly, this ultrafast gate is a viable approach for creating novel quantum well and spintronic devices.

B. Experimental Results

1. Gating Surface Quantum Wells with Light

Refer now to FIG. 1 through FIG. 4, which together illustrate tuning quantum well potentials through charge separation, and present a schematic of an exemplary device setup and the effect of infrared light pulses on the band-bending and quantum well state.

In a semiconductor 100, the SPV effect occurs when in-gap surface states lead to a redistribution of charge between the bulk 102 and surface 104 at equilibrium. This non-uniform charge distribution is called the space charge region (SCR) and produces an internal electric field that 'bends' the bands near the surface, as diagrammatically shown in FIG. 1. In the case of downward band-bending, illumination of the surface via an infrared pulse 106 generates photoexcited electrons 108 and holes 110 that drift to the surface 104 and bulk 102, respectively. These carriers partially cancel the internal electric field thereby reducing the band-bending and altering the surface potential in an excited region 112. Equivalently, the downward band-bending potential results in an internal electric field at equilibrium 114, ($E_{BB}$), and this electric field is reduced by an opposing electric field generated by the separated photoexcited charges. The consequence of this is a time-varying electric field in the bulk 102 that decays according to the recombination of separated photoexcited electron-holes (108-110). Hence, an SPV semiconductor substrate can serve as a time-dependent electric gate to 2D electronic states at the surface 104, and the infrared pulse 106 can be focused to gate a specific area of interest.

Here, $Bi_2Se_3$ samples were used, which have metallic surfaces 104 due to a topological surface state and host quantum well states which can be modified by the pump-induced time-dependent charge separation. In this way, the surface 104 of the SPV material itself is the subject of the electric field gating and is modified by the time-varying internal field. An added consequence of the photoinduced charge separation is that the resulting infinite dipole at the surface also produces an external electric field between the sample and the detector, $E_{vac}$ 116, that affects the detected kinetic energy of the photoelectron, resulting in a rigid energy shift of the measured dispersion, allowing one to track the SPV in real-time.

The $Bi_2Se_3$ samples in this example were p-type doped with a hole-like majority carrier concentration of $1\times10^{19}$ $cm^{-3}$, yielding a fairly conductive bulk that generates a narrow space charge region at the surface of approximately 10 nm.

Figure 2:
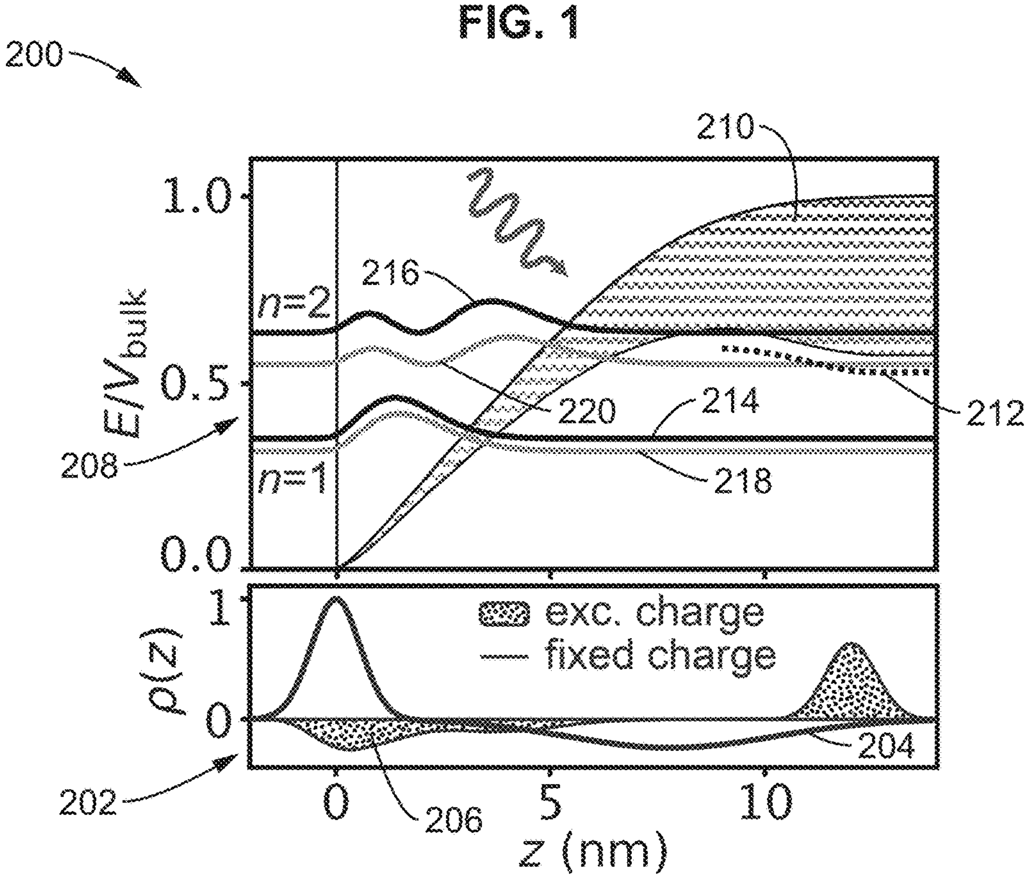
FIG. 2 is a graph of the photoexcited charge separation decreases the slope of the quantum well potential (from top to bottom). The quantum well energy levels (n=1, 2) before illumination (solid curves) are compressed in energy after the pump (dotted curves).

In FIG. 2, the effect of an optical pump on the band-bending potential and quantum well energy levels was modeled in two graphs. The lower plot 202 shows the distribution of fixed charges that form the equilibrium band-bending potential 204 and separated charges following photoexcitation 206. Photoexcited electrons are distributed equally in three parts between the surface and two quantum wells (using the quantum well wavefunctions to determine the density profile) and an equal number of photoexcited holes piled at the edge of the SCR. The band-bending length-scale is like the wavefunction spatial extension near the surface, such that only sufficiently separated charge on either side of the SCR can avoid high recombination rates in order to form a persisting SPV effect. The amplitudes of the excited charges with respect to the fixed charges have been exaggerated by 2× for visibility. The upper plot 208 shows the effect of the population of separated photoexcited charges on the quantum well potential is seen in the shaded region from darker to lighter 210. A secondary well forms at the bulk edge of the SCR 212 that limits the ability to trap holes in the bulk such that the quantum well potential is not quenched after SPV saturation at the highest fluence (saturation is shown below in FIG. 19). The squared modulus of the wavefunctions and corresponding energies have been calculated for the equilibrium and maximally pumped condition shown as black curves 214, 216 and gray curves 218, 220, demonstrating a compression of the energy eigenvalues.

Figure 3:
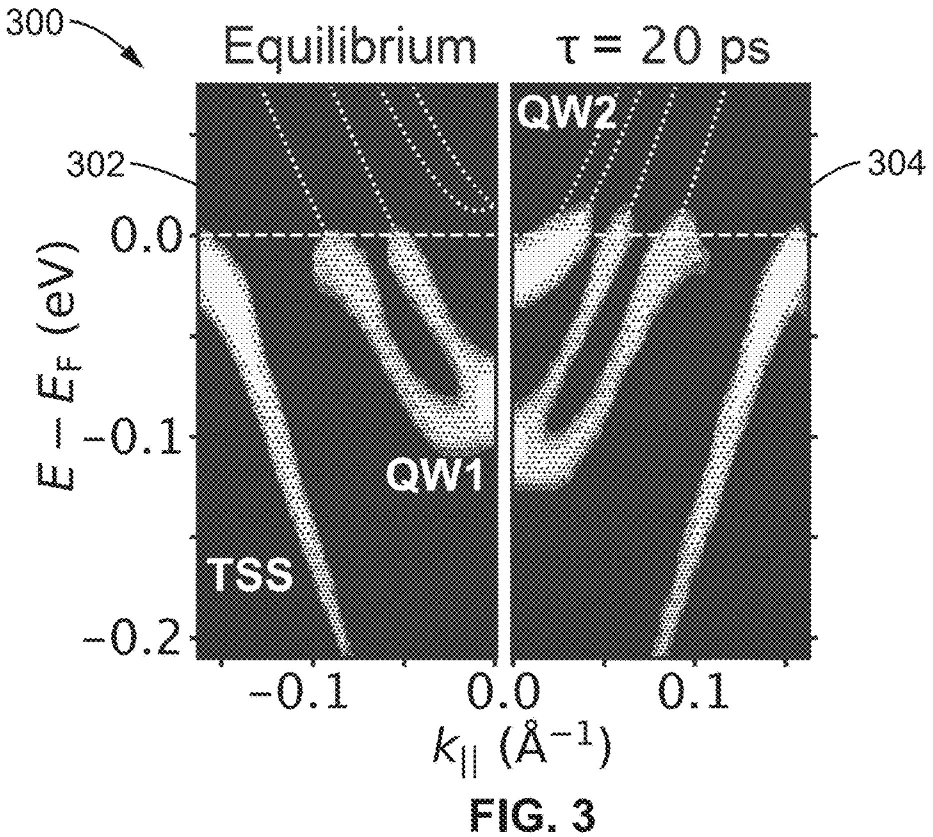
FIG. 3 is a graph of the $\partial^2 I/\partial E^2$ spectra at equilibrium and after a pump pulse demonstrating the spectrum modification.
Figure 4:
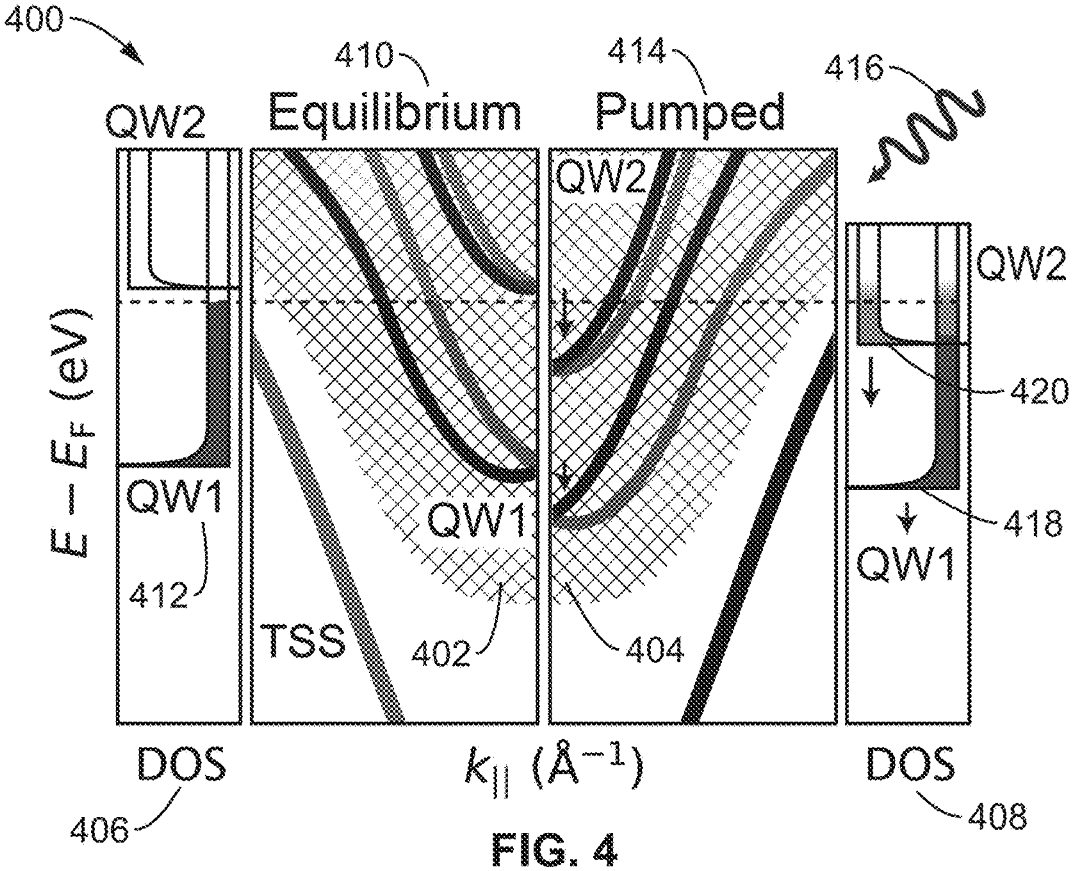
FIG. 4 is an illustration of quantum well level shifts in $Bi_2Se_3$ before and after illumination. The shaded parabolic region represents the conduction band before quantization. The DOS of Rashba-split bands exhibits a singularity near the band bottom. The photo-induced spectrum modification enables toggling of a Lifshitz transition.

FIG. 3 is a set of graphs 300 $\partial^2 I/\partial E^2$ ARPES spectra demonstrating the compression of the quantum wells at equilibrium 302 and after pump excitation 304 as also schematically summarized in FIG. 4. The strong downward band bending at equilibrium leaves the surface n-type doped, filling a large portion of the upper Dirac cone and the quantized conduction band, despite the p-doping in the bulk.

In FIG. 4, a set of graphs 400 show the first and second quantum wells, QW1 and QW2 are derived from the bulk conduction band (the shaded parabolic regions 402, 404 of FIG. 4) and exhibit near-parabolic dispersions. The strong spin-orbit coupling inherent to $Bi_2Se_3$ as well as inversion symmetry breaking at the cleave-plane generates a Rashba effect that duplicates the quantum well states into momentum-separated spin-polarized pairs (shown in grey and black curves in FIG. 4). Furthermore, the momentum splitting transforms the band minimum from point-like to a one-dimensional ring, resulting in a van Hove singularity below the intersection of the Rashba bands for both QW1 and QW2 (see DOS 406, 408 in FIG. 4).

At equilibrium 410, with no pump beam, only QW1 412 is populated, exhibiting strong Rashba splitting. After pumping 414 with a 51.8 μJ $cm^{-2}$ 820 nm pulse 416, QW1 418 and QW2 420 shift downwards in energy relative to the bulk conduction band minimum. QW1 shifts downward by approximately 25 meV and QW2 emerges below $E_F$ and is subsequently populated resulting in a sudden increase of the DOS 408. Therefore, the light-driven modification and subsequent filling of QW2 420 drives a van Hove singularity below the Fermi level, inducing a Lifshitz transition.

2. Dynamic Quantum Well Spectrum and Lifshitz Transition

Refer now to FIG. 5 through FIG. 9, which together illustrate time-resolved electric field gating of quantum well spectrum and demonstrate the evolution of the quantum well spectrum after ultrafast illumination. Since the SPV decays in time and the effective gating field depends on the SPV strength, a single time-resolved measurement records a continuum of the field effect on the quantum well.

Figure 5:
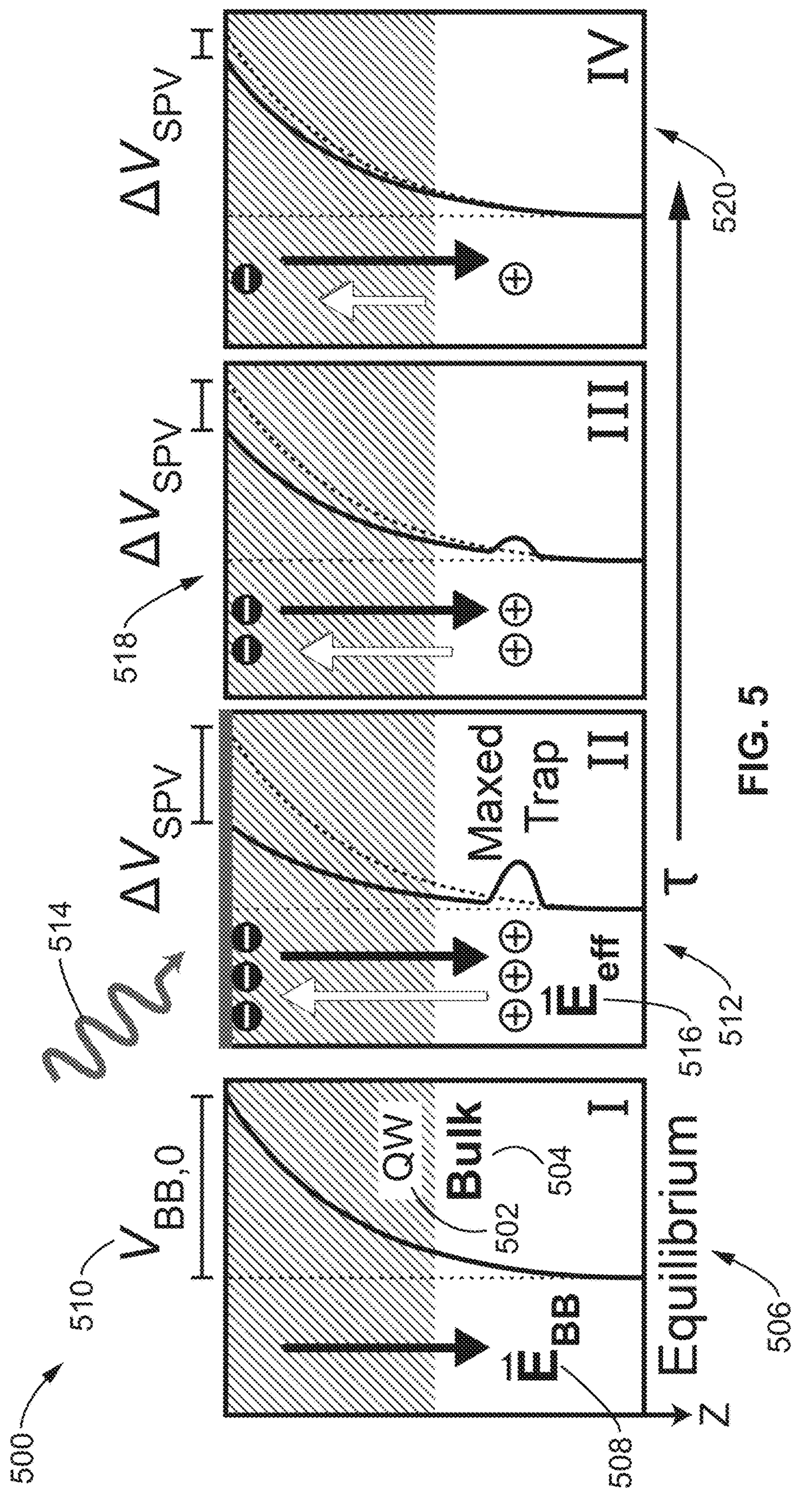
FIG. 5 is a set of graphs of effective applied field, $E_{eff}$, is generated by separated photoexcited carriers, manifesting as a reduction of the band-bending potential. Surface photovoltage (SPV) is maximized before quenching the band-bending due to a finite limit on trapped holes. As photoexcited charge recombines over time (τ), band-bending returns and the effective field is reduced.

FIG. 5 is a series of four plots 500 illustrating the field effect on surface confined quantum well as a function of delay. The upper patterned region denotes the quantum well (denoted QW 502) SCR confinement at the surface and the lower unpatterned region represents the near-surface bulk (Bulk 504). At equilibrium (I, 506), the band-bending is maximal resulting in an enhanced slope for the quantum well potential and can be represented by an internal electric field $E_{BB}$ 508. The maximum reduction in the band-bending is the potential difference between the surface and deep within the bulk at equilibrium, labeled $V_{BB,0}$ 510. At τ=0 (II, 512), when the pump pulse 514 arrives, separated photoexcited carriers generate an opposing electric field to $E_{BB}$, labeled $E_{eff}$. The internal field from the separated carriers acts as an effective applied field on the quantum well potential, driving the time-dependent modification to the spectrum. In the illustrated scenario, the pump pulse 514 is significantly strong so as to saturate the available hole trap sites altering the surface potential as a function of delay by $\Delta V_{SPV}(\tau)=V_{BB,0}-V_{BB}(\tau)$, resulting in reduced but non-zero band-bending. At more positive delays (III 518 to IV 520), the excited charge recombines thus reducing the effective field $E_{eff}$, reviving the band-bending potential, and bringing the surface potential back to its equilibrium value.

The photoexcited charge separation can be monitored through the energy shift of the ARPES spectrum induced by the in-vacuum field produced by $\Delta V_{SPV}$. The change in the surface potential has the effect of increasing the photoelectron kinetic energy at the detector with respect to the equilibrium energy position (ΔKE).

Figure 6:
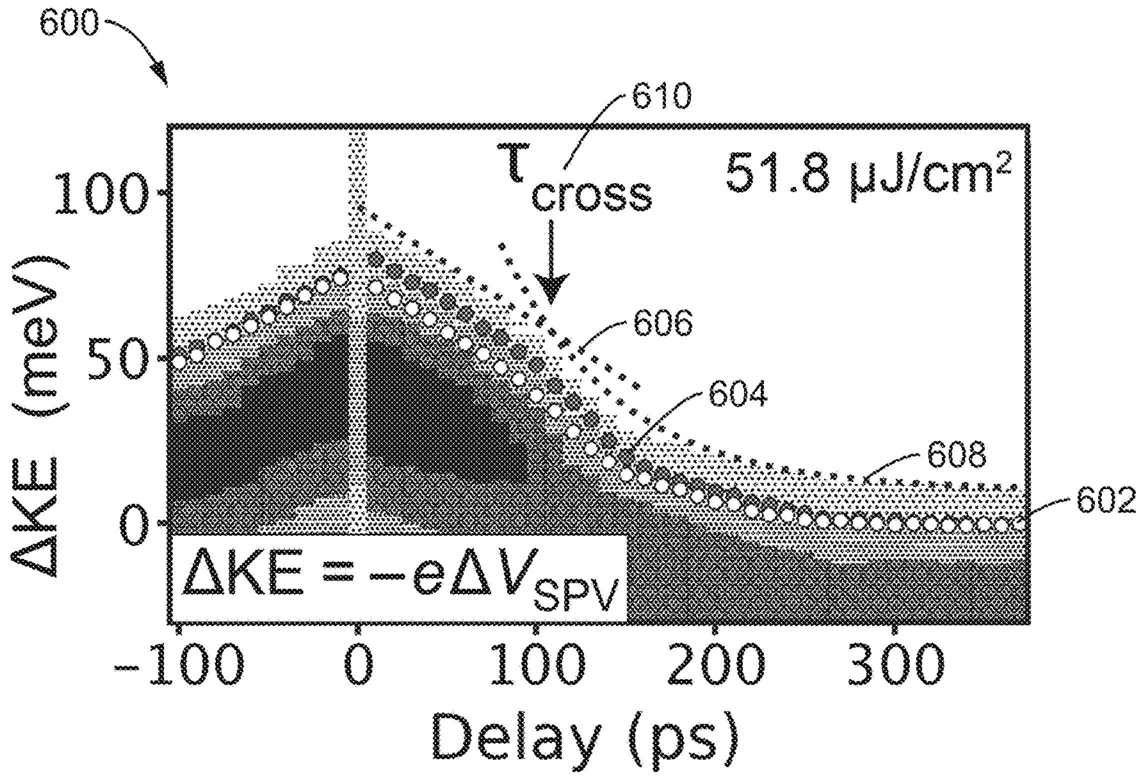
FIG. 6 is graph of separated surface charge can be monitored by the rigid energy shift of the ARPES spectrum due to the voltage change at the surface ($\Delta V_{SPV}$). Open dots correspond to the SPV-induced rigid shift of the band structure relative to equilibrium $E_F$, solid dots correspond to the quasi-Fermi level at $k_F$ of the topological surface state (TSS).

Refer now to FIG. 6, which is a graph 600 presenting the effect of the SPV rigid shift on the topological surface state at the Fermi wave vector as a function of delay. The rigid shift of the spectrum extracted from the shift of the Dirac dispersion at fixed momenta well below $E_F$ is plotted in open dots 602. The Fermi edge as determined by fitting a Lorentzian multiplied by a Fermi-Dirac distribution is plotted in solid dots 604 and denotes the quasi-Fermi level, $E_F^*$. The rigid energy shift is a direct measure of the surface potential as a function of delay since ΔKE( )=−e$\Delta V_{SPV}(\tau)$, where e is the charge of the electron.

Under the center of charge approach, the SPV signal can be described by an average displacement of electron and hole sheet charges induced by the band banding such that:

$$\Delta V_{SPV} = \frac{e}{\varepsilon_r \varepsilon_0} n_{sep} d \tag{1}$$

where $n_{sep}$ and d are the charge separation density and separation distance, respectively, and $\varepsilon_r\varepsilon_0$ the dielectric constant of $Bi_2Se_3$. With the assumption that the separation distance is fixed and approximately equal to the width of the band-bending region, then the measurement of $\Delta V_{SPV}$ is proportional to the charge separation concentration $n_{sep}$, and therefore the charge at the surface. To be clear, this is different than the total photoexcited carriers generated by the pump since significant recombination has taken place after 10 ps, with only sufficiently separated charges.

Moreover, if the charge is sufficiently separated and localized (a fit assumption based on the long lifetime of the SPV), then the photoinduced charge separation is analogous to a parallel plate capacitor within the probe beam spot and the effective applied field is also proportional to $\Delta V_{SPV}$ and the surface charge. Therefore, the ΔKE shift (FIG. 6 for τ>0) decays proportionally to the separated charge density (FIG. 6 for τ>0), enabling one to map the delay axis to a surface voltage and ultimately an applied field strength (discussed in FIG. 10 through FIG. 13 below).

At negative delays (photoemission occurs before the pump) there is a rigid shift of the recorded ARPES spectrum. This effect is due to the photoelectron interacting with an SPV generated field induced by a pump pulse that arrives after photoemission. The rigid energy shift in the negative delay is therefore shifting the unpumped spectrum and can be ignored for the purposes of this study.

In the positive delay, a maximum ΔKE shift of 72.0 meV is reached at 10 ps after 51.8 μJ $cm^{-2}$ illumination. Between 10 ps and 125 ps, the SPV induced shift follows an unusual linear decay profile 606. After 125 ps the SPV decays exponentially 608 with a time constant of approximately 53 ps. This apparent discrete transition from a linear decay mechanism to an exponential decay is associated with the transit of QW2 above the Fermi level, $\tau_{cross}$ 610. In the absence of surface quantum wells, $Bi_2Se_3$ exhibits a simple exponential decay with no linear region or kink.

Figure 7:
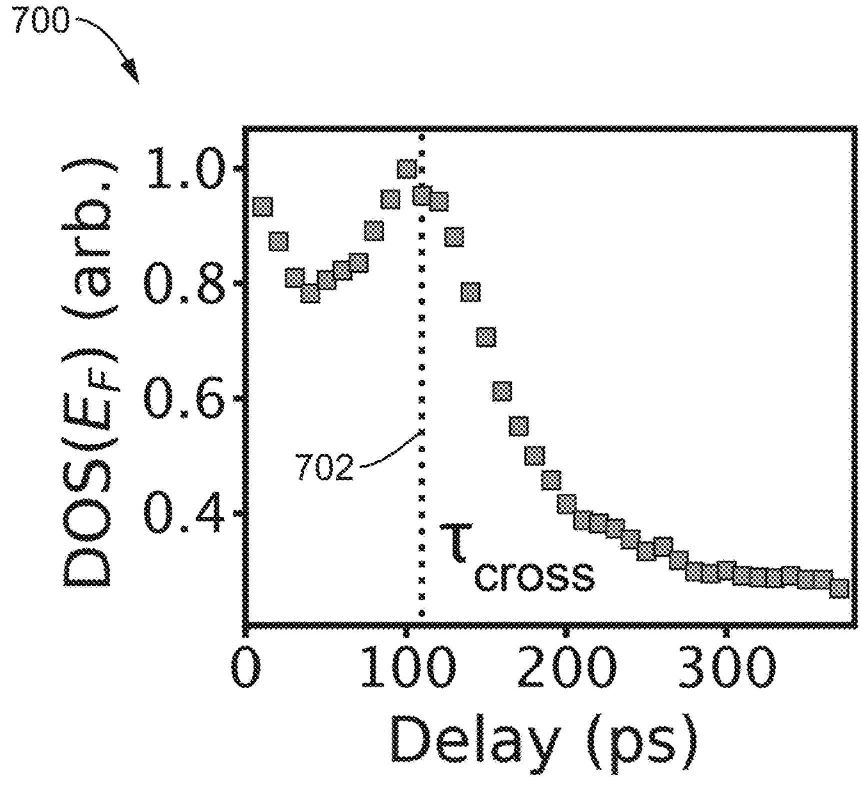
FIG. 7 is a graph of the density of states (DOS) at the Fermi level as a function of delay revealing the Lifshitz transition of QW2.

FIG. 7 is a graph 700 that shows the DOS at the Fermi level, E=(−0.005, 0.005) eV, and at zero momentum, k=(−0.005, 0.005) $Å^{-1}$, demonstrating the crossing 702 of the QW2 band bottom and indicating the Lifshitz transition as QW2 relaxes.

Figure 8:
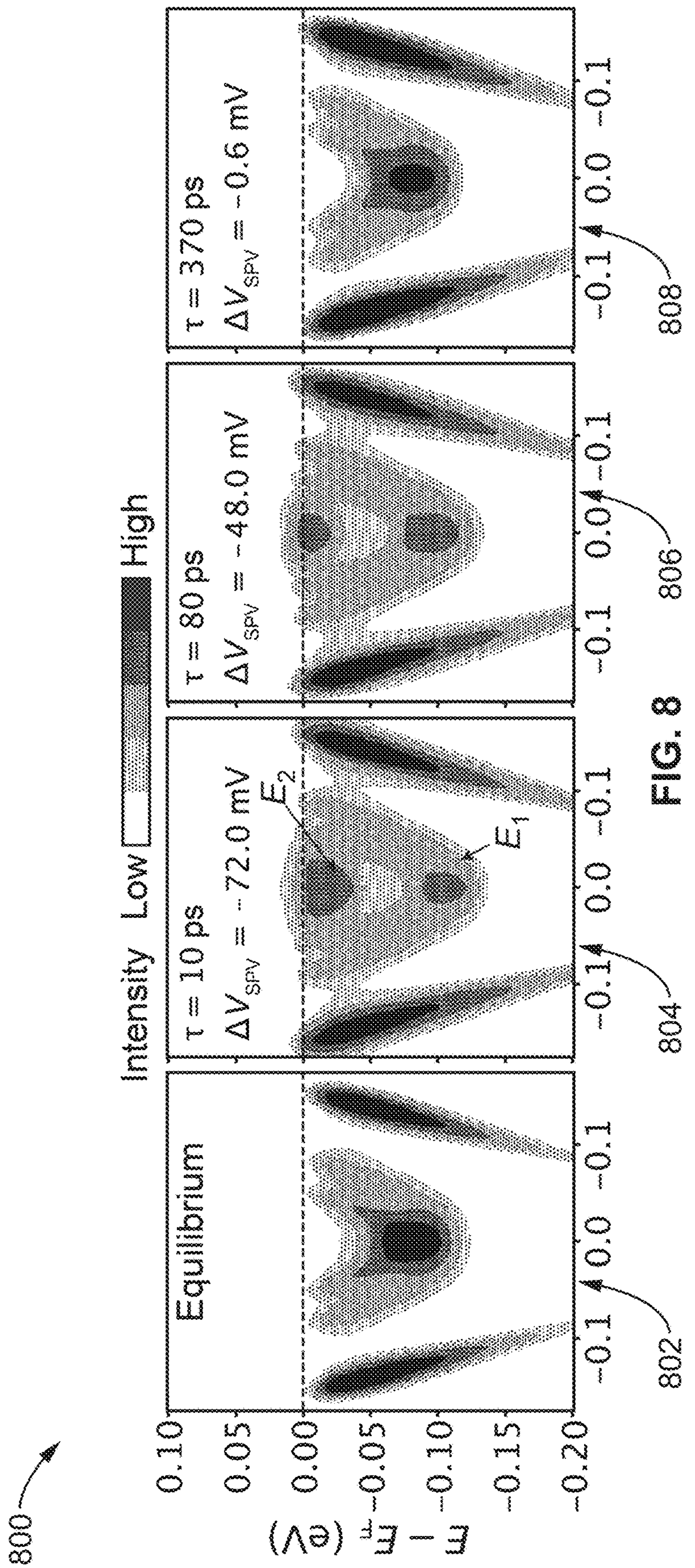
FIG. 8 is a set of graphs of symmetrized angle-resolved photoemission spectroscopy (ARPES) spectra at equilibrium and three different non-equilibrium delays demonstrating the pump-induced quantum well shifts after correcting the SPV shift.
Figure 9:
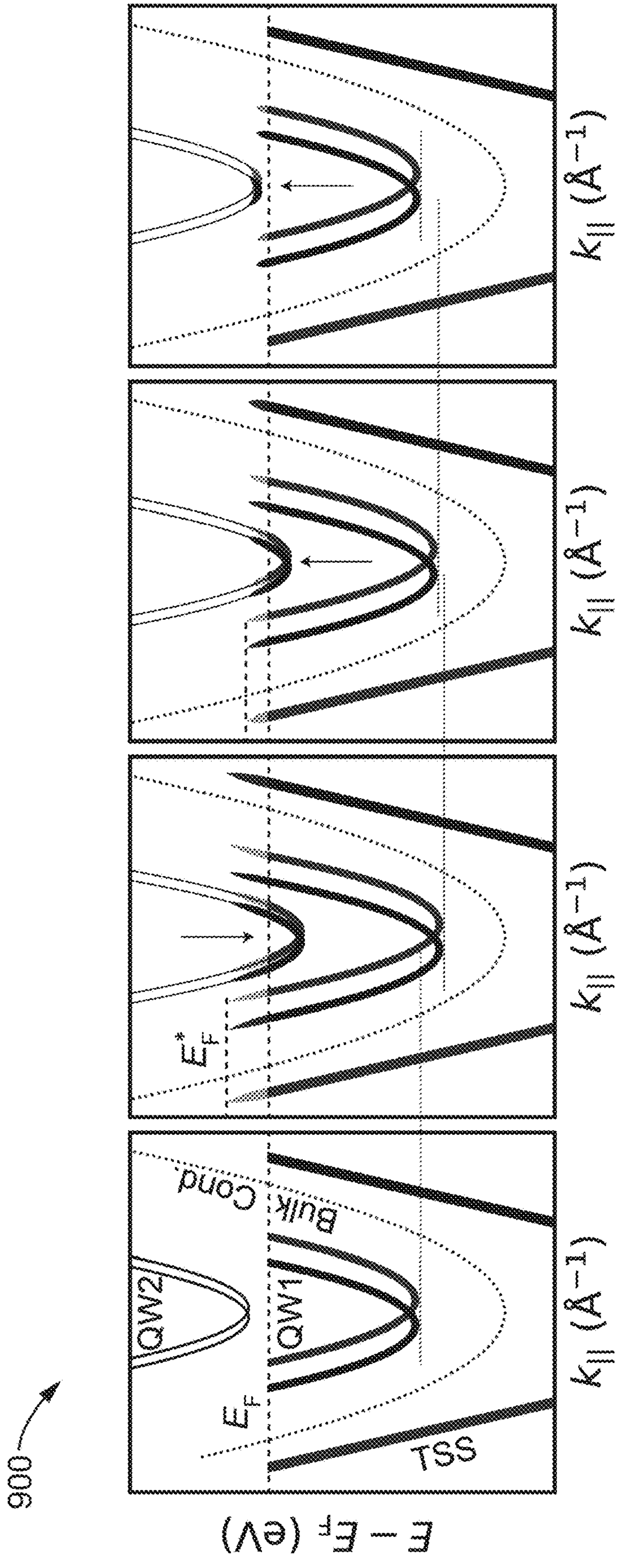
FIG. 9 is a set of graphic summarizing quantum well spectrum dynamics corresponding to the spectra in FIG. 8, presenting a delay-dependent field effect on the quantum wells and long-lived quasi-$E_F$.

The continuous photo-induced modification of the quantum wells is observed in FIG. 8, which displays four spectra 800 of the $Bi_2Se_3$ quantum well spectrum at equilibrium 802 and at three separate delay values 804, 806, 808 and then schematically simplified in FIG. 9. The spectra have been shifted to compensate for the extrinsic delay-dependent rigid energy shift associated with the SPV effect (the open dots in FIG. 6). At equilibrium (far left 802), only the topological surface state and QW1 are present and occupied below the Fermi level, $E_F$. The full band-bending is present creating a steep quantum well potential as described in Scenario I of FIG. 5. This results in a large energy spacing for QW1 and QW2, leaving QW2 unpopulated above $E_F$.

For the pumped spectrum, the data at 10 ps is first observed 804. By this time, nearly all hot carrier recombination has already taken place, leaving behind long-lived trapped charges. QW1 shifts downward in energy and QW2 falls below $E_F$ as photoexcited charges have reduced the equilibrium band-bending modifying the quantum well potential; QW2 is subsequently filled below $E_F$ and states above $E_F$ are populated resulting in a new quasi-equilibrium Fermi level. At $\tau$=80 ps 806, the quantum well spectrum drifts towards higher energies relative to the topological surface state and $E_F$. The competition between the rate of charge being pushed above $E_F$ by the upward energy shifts (dotted horizontal lines in FIG. 9) and the decay rate of charge above $E_F$ allows charge to exist above the Fermi level during the course of the spectrum relaxation. This ultimately leads to excess charge remaining in QW2 at $\tau$=370 ps 808 even when the quantum well energy spacing has returned to equilibrium. For each delay from 10 ps 804, to 80 ps 806, to 370 ps 808, one can determine the photoinduced change in the surface potential, $\Delta V_{SPV}(\tau)$, from ΔKE in FIG. 6, thereby tracking the quantum well modifications as a function of surface voltage.

In FIG. 9, a set 900 of schematically simplified graphs are presented that correspond to the continuous photo-induced modification of the quantum wells observed in FIG. 8, where four spectra 800 of the $Bi_2Se_3$ quantum well spectrum at equilibrium 802 and at three separate delay values 804, 806, and 808.

3. Reduction of Quantum Well Spacing and Prolonged Charge Storage

The delay dependence of the quantum well level spacing and charge occupation is further investigated to better understand the pump-induced quantum well state modification.

Refer now to FIG. 5 through FIG. 9, where it is demonstrated that the surface potential is a function of delay, so one is able to track the quantum well modification with respect to surface voltage. This can be taken one step further to estimate the effective field, $E_{eff}$, from the energy positions of the QW1 and QW2 band bottoms.

Figure 10:
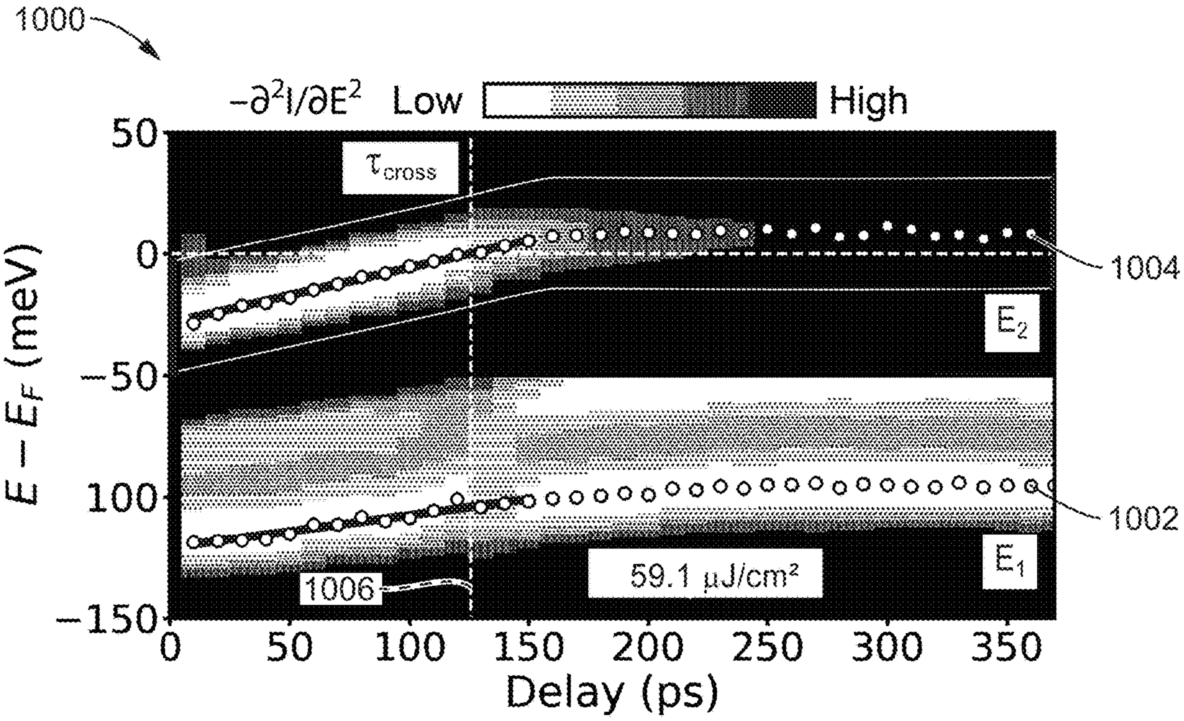
FIG. 10 is a graph of $\partial^2/\partial E^2$ spectra of QW1 and QW2 band bottoms as a function of delay. The band bottom positions are marked by dots demonstrating a near-linear recovery up to the moment $E_2$ crosses $E_F$, $\tau_{cross}$.

FIG. 10 through FIG. 13 illustrate quasi-equilibrium charge and ultrafast intersubband-gap control. FIG. 10 displays 1000 momentum integrated $\partial^2 I/\partial E^2$ spectra for QW1 and QW2 band bottoms as a function of delay. The momentum integration windows for QW1 and QW2 band bottoms are centered at k=0.000 $Å^{-1}$ and k=0.023 $Å^{-1}$, respectively, with a width of Δk=0.002 $Å^{-1}$. The QW1 and QW2 band bottom positions, $E_1$ 1002 and $E_2$ 1004 (open dots) track the evolution of the energy levels as the quantum well spectrum is modified by the field effect and subsequent relaxation. The positions of $E_1$ and $E_2$ were displayed in FIG. 8 for comparison with the full dispersion. After pump illumination, QW1 and QW2 shift toward higher binding energies, dropping QW1 by ~25 meV and QW2 by ~35 meV and bringing QW2~25 meV below $E_F$. Both quantum wells shift back towards lower binding energies linearly as a function of delay at different rates. For QW2, 126 ps corresponds to $\tau_{cross}$ (see vertical dashed line 1006 in FIG. 10), the delay time in which the band bottom crosses $E_F$. After this point, spectral intensity of the band bottom decreases at an accelerated rate.

An important property of quantum well systems is the intersubband-gap, defined as the difference in energy between the QW2 and QW1 band bottom energies $\Delta E = E_2 - E_1$, which sets crucial material properties including the optical response. The delay dependence of the quantum well band bottom positions, and therefore the surface potential dependence of the intersubband-gap, demonstrates ultrafast-field tunability.

Figure 11:
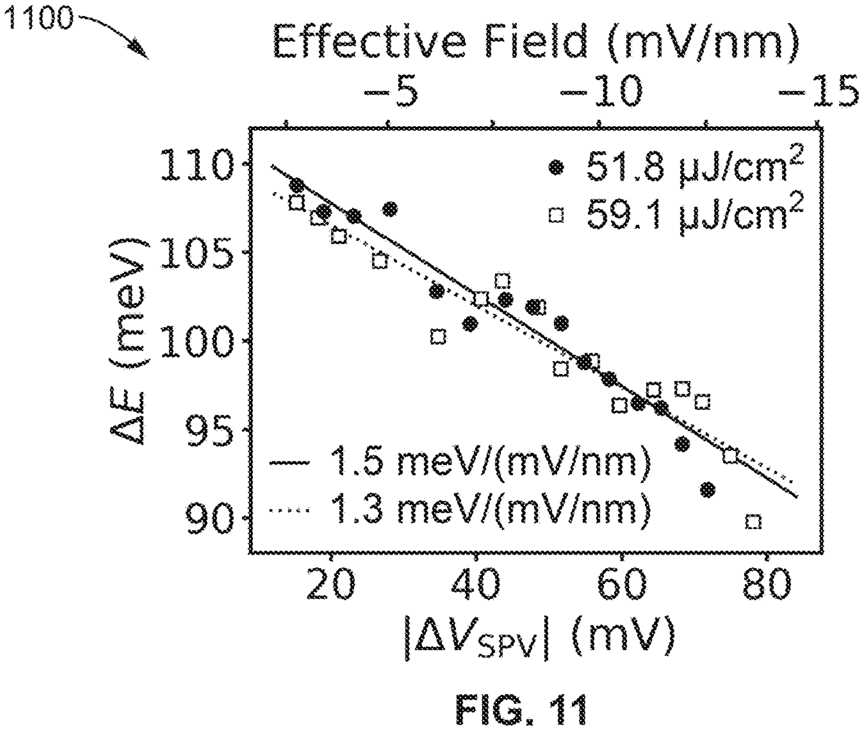
FIG. 11 is a graph of the intersubband-gap as a function of the SPV determined at each delay for the two highest fluences (51.8 and 59.1 μJ cm$^{-2}$). The effective field on the quantum well system is extrapolated from the average best fit line and the triangular-well approximation.

FIG. 11 is a graph 1100 that shows the potential dependence of the intersubband-gap ΔE for the two highest fluences. Here, the band-gap values for $\tau<\tau_{cross}$ where QW2 is fully populated, and the position of the band bottom is not strongly influenced by the Fermi level.

The effective applied field on the quantum well spectrum can be extrapolated from the intersubband-gap. The triangular-well potential is a widely used approximation to describe surface confinement, especially for low-energy wavefunctions, and is suited for capturing the effective electric field experienced by the quantum wells. A more precise model of the confinement potential may be necessary in the condition of higher energy wavefunctions (n>2).

The triangular-well potential is described by V(z)=eFz, where F represents the steepness of the well with units of electric field. As such, the quantum well wavefunctions take on the form of Airy functions with energy eigenvalues:

$$\varepsilon_n = c_n \left[ \frac{(eF\hbar)^2}{2m^*} \right]^{1/3} \tag{2}$$

The energy eigenvalues, $\varepsilon_n$, are referenced to the bulk conduction band minimum before quantization, which represents the bottom of the quantum well potential. By subtracting $\varepsilon_1$ from $\varepsilon_2$, the equation can be rearranged to solve for F using only the intersubband-gap energy, and the known Airy coefficients, $c_1 \cong 2.338$ and $c_2 \cong 4.088$.

$$F = \frac{\sqrt{2m^*}}{e\hbar} \left( \frac{\Delta E}{C_2 - C_1} \right)^{3/2} \tag{3}$$

Utilizing the above equation and the average best fit lines from FIG. 11, the x-axis can be rescaled in terms of the effective applied field on the QW states. The average effective mass from dispersion fits of $m^*=0.45\ m_e$ is used. The total electric field in the quantum well region at equilibrium ($\Delta V_{SPV}=0$) is 42.0 mV $nm^{-1}$ and 55.7 mV $nm^{-1}$ at the maximal SPV ($\Delta V_{SPV}$=78.5), reasonable electric field values for surface quantum well systems. This is equivalent to applying a field, $E_{eff}$ between 0 mV $nm^{-1}$ ($\Delta V_{SPV}$=0 mV) and 13.7 mV $nm^{-1}$ ($\Delta V_{SPV}$=78.5 mV) opposite to the equilibrium band-bending field $E_{BB}$.

The field effect on the intersubband-gap shown in FIG. 11 exhibits a nearly linear dependence since the quantum well electric field, F, is always far from 0, existing in the range of (40-60 mV $nm^{-1}$). The applied field axis ticks are determined by the y-axis values of the best fit line and are independent of the surface voltage axis. The even spacing of both x-axis ticks demonstrates that the intersubband gap is near-linear in both surface voltage and effective electric field, as expected from the center of charge separation model in Equation (2).

In addition to enabling an ultrafast field effect on the quantum well energy positions and intersubband-gap, the ultrafast gating grants access to the charge dynamics of the quantum well spectrum. In particular quasi-equilibrium charge occupation and determine recombination timescales were uncovered, not accessible by any static gating technique. Furthermore, it was observed that the crossing of the QW2 band bottom above $E_F$ (vertical dashed line 1006 in FIG. 10, $\tau_{cross}$=126 ps at 59.1 μJ $cm^{-2}$) corresponded to the transition of the SPV relaxation from a linear to an exponential decay mechanism as observed in FIG. 6.

Figure 12:
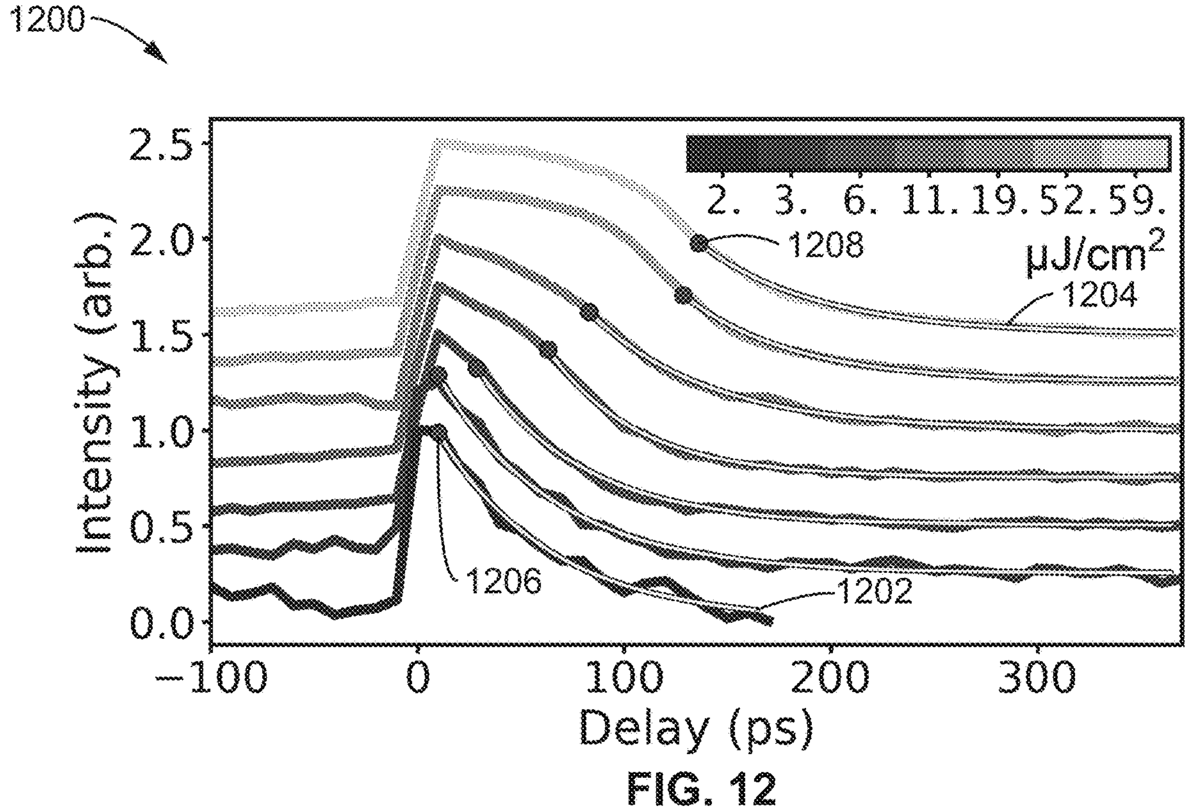
FIG. 12 is a graph of integrated spectral intensity of the QW2 band bottom using integration window in FIG. 10 over a large fluence range. $E_F$ crossing time, ($\tau_{cross}$), +10 ps is used as a cutoff (minimum set at 10 ps) for exponential fits (solid dots).

Refer now to FIG. 12, which displays a graph 1200 of the integrated spectral intensity of the QW2 band bottom as a function of delay (white outlined region in FIG. 10) for fluences between 1.5 (1202) and 59.1 μJ $cm^{-2}$ (1204), showing stable charge storage before fluence-dependent $\tau_{cross}$ values that then depopulate exponentially. At the lowest fluences, there is no stable region and only exponential behavior. The decay regions (to the right of the dots on the curve, e.g., 1206, 1208) are fitted with exponential fits, with the start of the fitting range (starting with the dots) set by $\tau_{cross}$+10 ps and a minimum cutoff of 10 ps.

Figure 13:
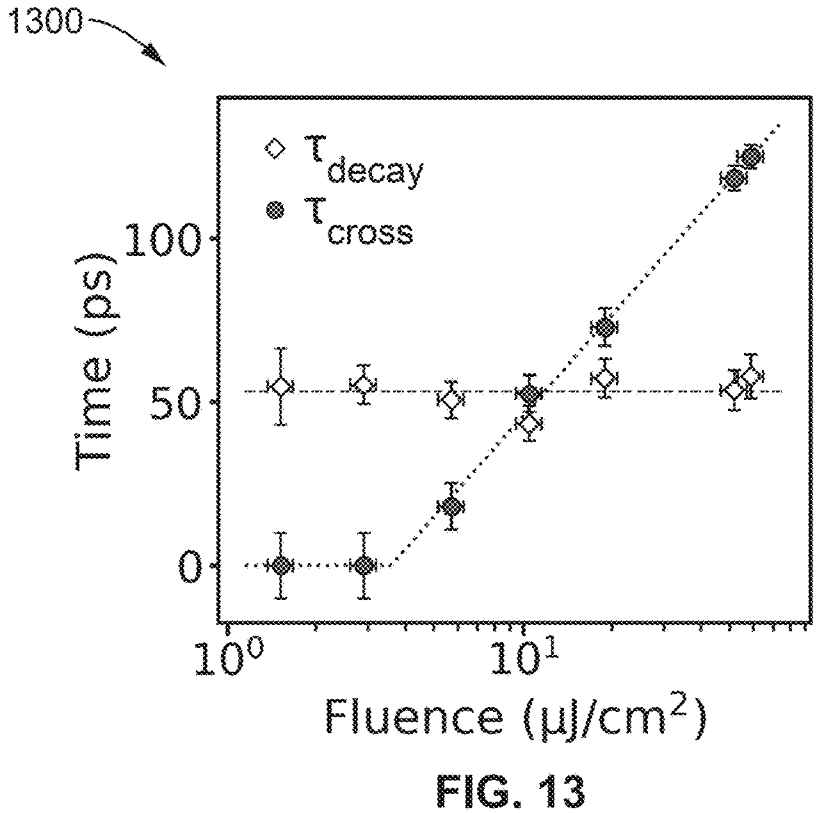
FIG. 13 is a graph of QW2 decay rate, $\tau_{decay}$, (open diamonds) and $\tau_{cross}$ (circles) as a function of maximum SPV at each fluence (and extrapolated effective field on QWs) indicating that the lifetime of QW2 states above $E_F$ is fixed but quasi-equilibrium lifetime is set by peak field strength. The y-axis error bars are from fit covariance in FIG. 12 ($\tau_{decay}$).

As a function of fluence, the resulting timescales from the exponential fit, $\tau_{decay}$, are plotted in the graph 1300 of FIG. 13 (diamonds) alongside $\tau_{cross}$ (dots). The decay rate of charge in QW2, $\tau_{decay}$, is independent of fluence with an average decay time of 53 ps. On the other hand, $\tau_{cross}$ increases logarithmically for fluences above 4 μJ $cm^{-2}$, marking a critical fluence for the Lifshitz transition of QW2. For fluences in which the $\tau_{decay}$=0, QW2 never dips below $E_F$ after the pump, and therefore does not undergo a Lifshitz transition.

Altogether, this demonstrates that the charge stored in QW2 is stable while it is below $E_F$ and charge above $E_F$ decays with a timescale of approximately 53 ps. Moreover, the timescale for stable stored charge in QW2, $\tau_{cross}$, is a consequence of the dynamic Lifshitz transition and can be controlled by varying the pump fluence, equivalent to increasing the SPV strength.

4. Ultrafast Reversible Reduction of Rashba Splitting in QW1

Another appealing capability of time-resolved photo-gating is the ultrafast control and tunability of the Rashba splitting since the Rashba effect depends on the inversion symmetry breaking electric field at the surface and can therefore be tuned by an applied field. The Rashba effect is an energy splitting that is, in the simplest form, linear in momentum with $\Delta E_R=\alpha_R k$ where $\alpha_R$ is known as the Rashba parameter. In the case of parabolic bands, this leads to a rigid splitting in momentum $k_0=\alpha_R m/\hbar$. By directly fitting the bands, one can obtain an accurate determination of $\alpha_R$.

Figure 14:
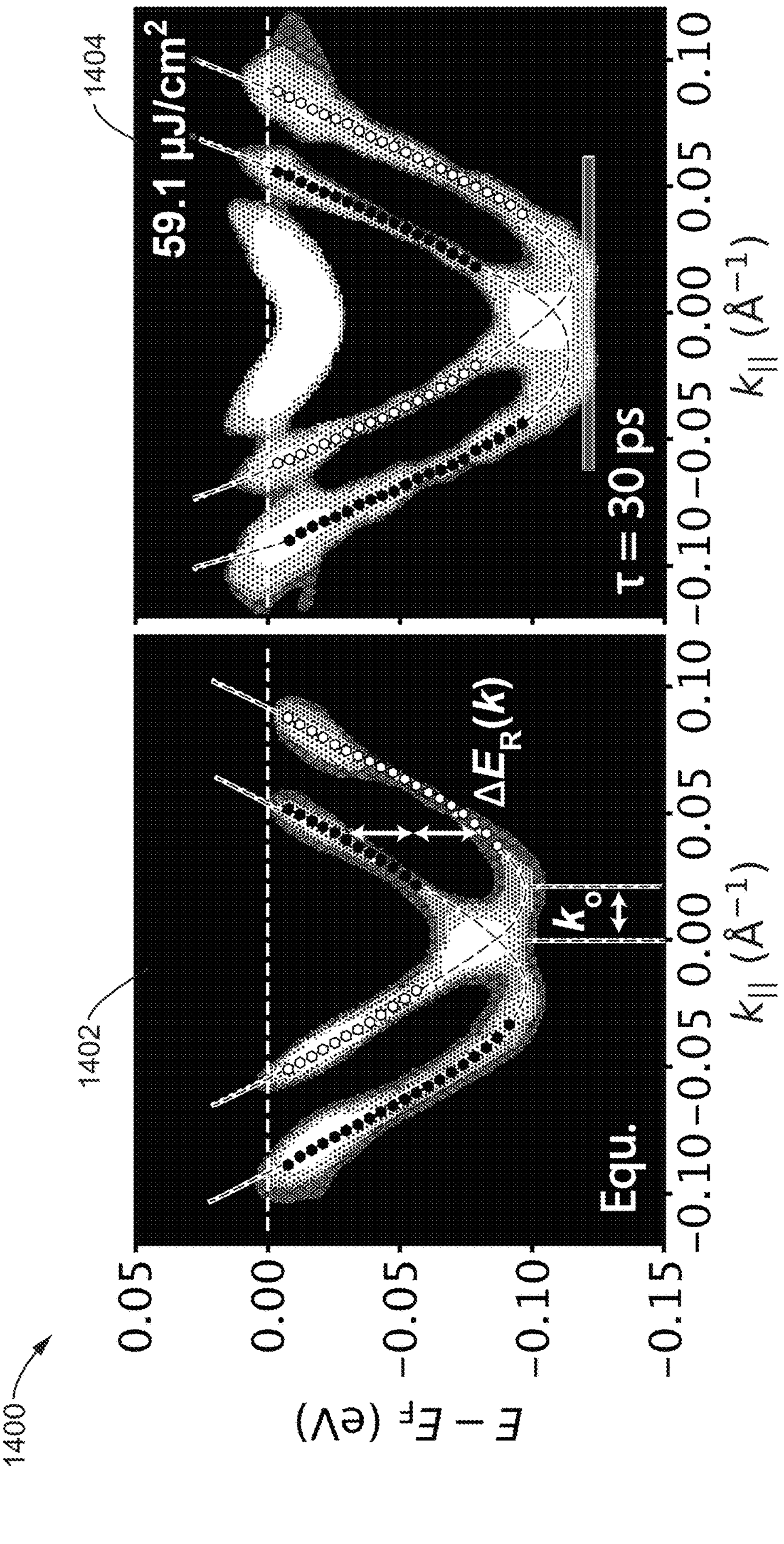
FIG. 14 are graphs of $\partial^2 I/\partial E^2$ non-symmetrized spectra of quantum well states at equilibrium and 30 ps. Solid and open dots correspond to respective spin-split Rashba band positions for QW1.

Refer now to FIG. 14 through FIG. 17, which illustrate the ultrafast field effect on Rashba splitting. FIG. 14 illustrates graphs 1400 of band fitting of the Rashba-split QW1 band at equilibrium 1402 and τ=30 ps 1404 after the pump is presented. The momentum positions of the Rashba bands as a function of energy (solid and open dots) were determined by peak fitting the momentum distribution curves (MDC) along delay-dependent binding energy ranges and avoiding the crossing of the two parabolic bands at zero momentum ($k_{\parallel}$=0).

Figure 15:
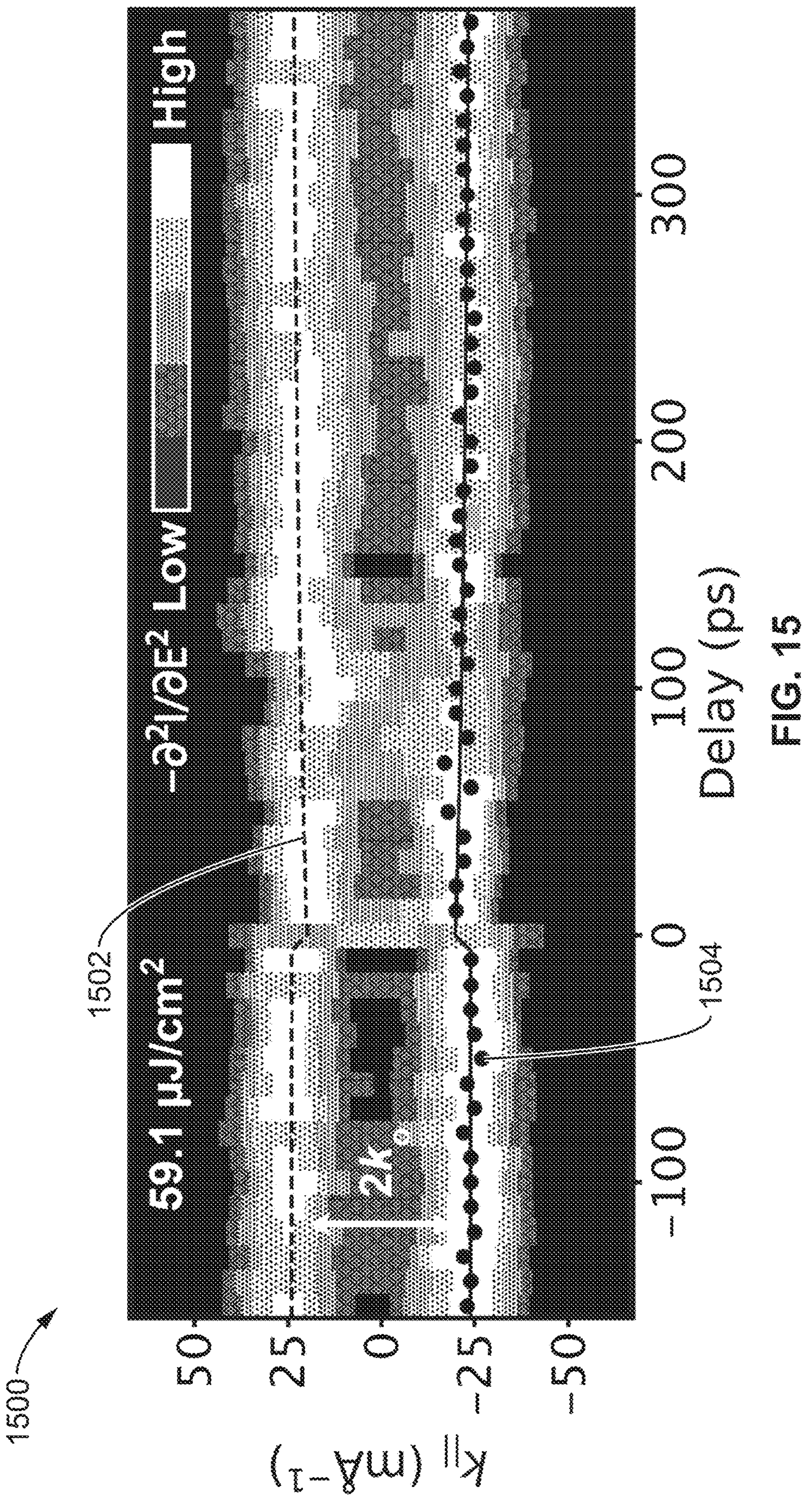
FIG. 15 is a graph of $\partial^2 I/\partial E^2$ non-symmetrized spectra integrated 15 meV below QW1 band bottom as a function of delay. Dots indicate peak positions on the negative-k band bottom, solid lines represent 15% reduction in $k_0$ after pump that relax to equilibrium.

FIG. 15 presents a graph 1500 of the delay dependence of the Rashba splitting, which is clearly seen in the QW1 band bottom momentum positions captured by integrating the second derivative in energy spectra from FIG. 14 over a narrow energy range 15 meV below the dispersion, avoiding the increased intensity at the Rashba intersection at Γ. The dashed curve 1502 serves as a guide to the eye, indicating a 15% reduction in $k_0$ at τ=0 that returns to equilibrium. The peak positions for the negative-momentum band bottom are plotted in dots 1504 and closely follow the 15% reduction.

Figure 16:
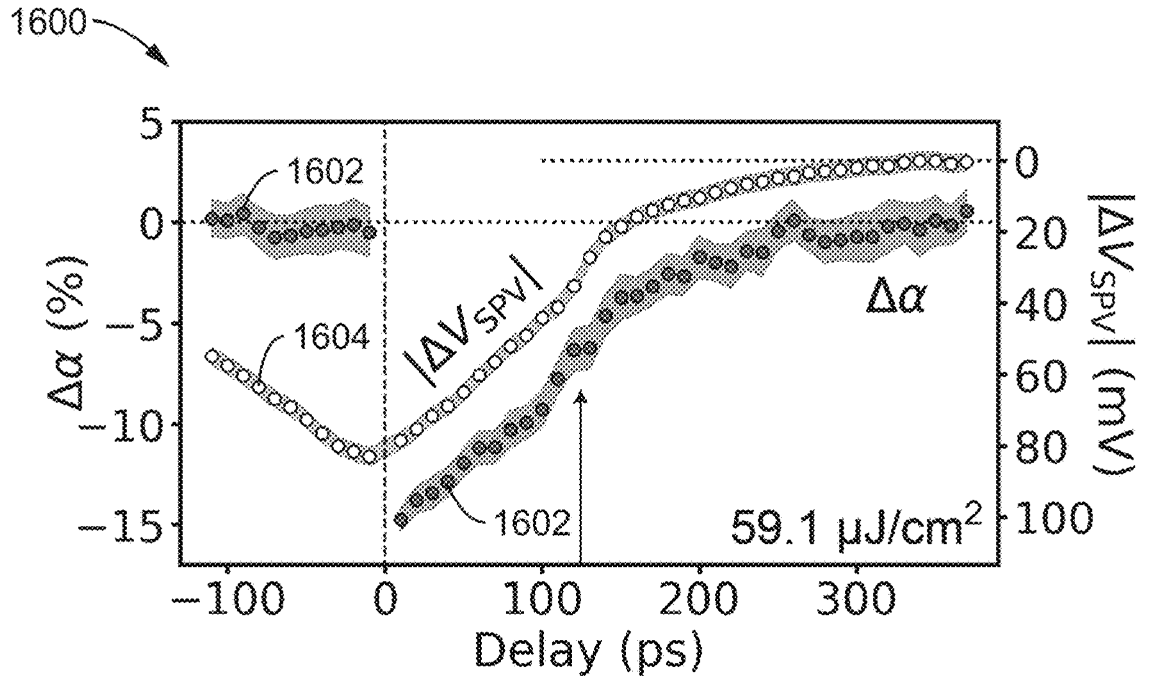
FIG. 16 is a graph of the percentage change of the Rashba parameter (solid dots) as a function of delay compared to the delay-dependent SPV (open dots) at 59.1 μJ cm$^{-2}$. After pump excitation, Rashba parameter drops by 15% and experiences a linear onset to exponential recovery (vertical arrow). The shaded outlines represent error propagated from covariance in fits from FIG. 14

FIG. 16 is a graph 1600 that presents the resulting change in Rashba parameter (grey dots 1602) as a function of delay at high pump fluence (59.1 μJ $cm^{-2}$) as determined by the dispersion fits in FIG. 14. In the negative delay, the Rashba parameter remains constant at its equilibrium value. Upon illumination the Rashba parameter drops by ~15% and then linearly returns towards equilibrium up until ~125 ps (vertical arrow). From then on, the Rashba parameter exponentially returns to the equilibrium value on a timescale of 53 ps. The decay behavior of the Rashba parameter closely matches the SPV decay (open dots 1604) in which a linear decay transitions into an exponential decay near 125 ps. This demonstrates a linear relationship of the Rashba effect with respect to the surface photovoltage and therefore the applied effective field, and subsequently dependent on the dynamic Lifshitz transition.

Figure 17:
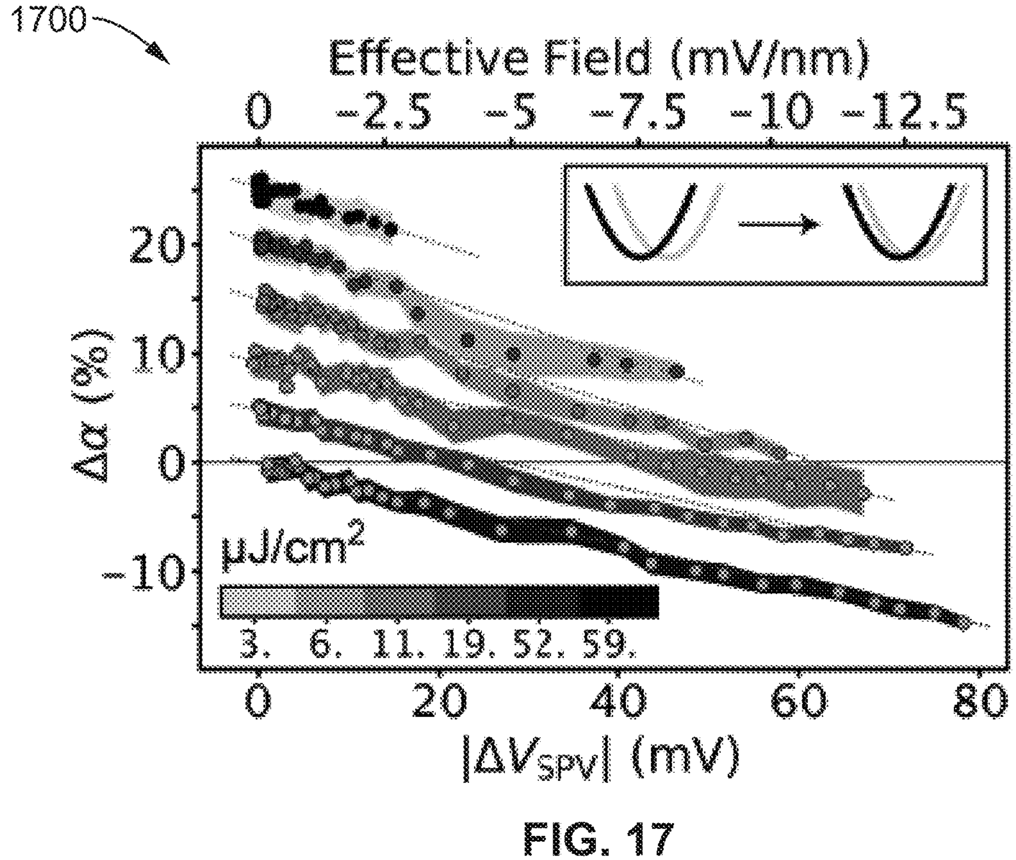
FIG. 17 is a graph of percentage change of the Rashba parameter versus SPV (and extrapolated effective field) over a large fluence range. Each fluence measurement is spaced by 5% for visibility. The shaded outlines represent error propagated from covariance in fits from FIG. 14.

FIG. 17 is a graph 1700 that plots the percent change of the Rashba parameter as a function of the SPV at each delay as well as the extrapolated effective field on the quantum well. The curves are spaced artificially by 5% intervals for clarity. The field effect behavior of the Rashba parameter is linear for all fluences, decreasing as the applied field is driven to more negative values with ~15% reduction in Rashba splitting at a maximal applied field of 13.5 mV $nm^{-1}$. From the average of the fluence measurements, the response of the Rashba parameter versus field strength is 1.26±0:21% nm $mV^{-1}$. This ultimately demonstrates precise control of the Rashba splitting of the quantum well states with ultrafast photo-gating, with the Rashba parameter tuned by the pump pulse intensity and dependent on the Lifshitz mediated relaxation.

5. Lifshitz-Dependent Surface Charge Trapping

Refer now to FIG. 18 through FIG. 22, which finally demonstrate a non-monotonic dependence of the quasi-Fermi level, $E_F$*, with respect to fluence that demonstrates the significance of the Lifshitz transition on the infrared response of the quantum well system. Those figures illustrate competition between surface state trapping and the quasi-Fermi level.

Figure 18:
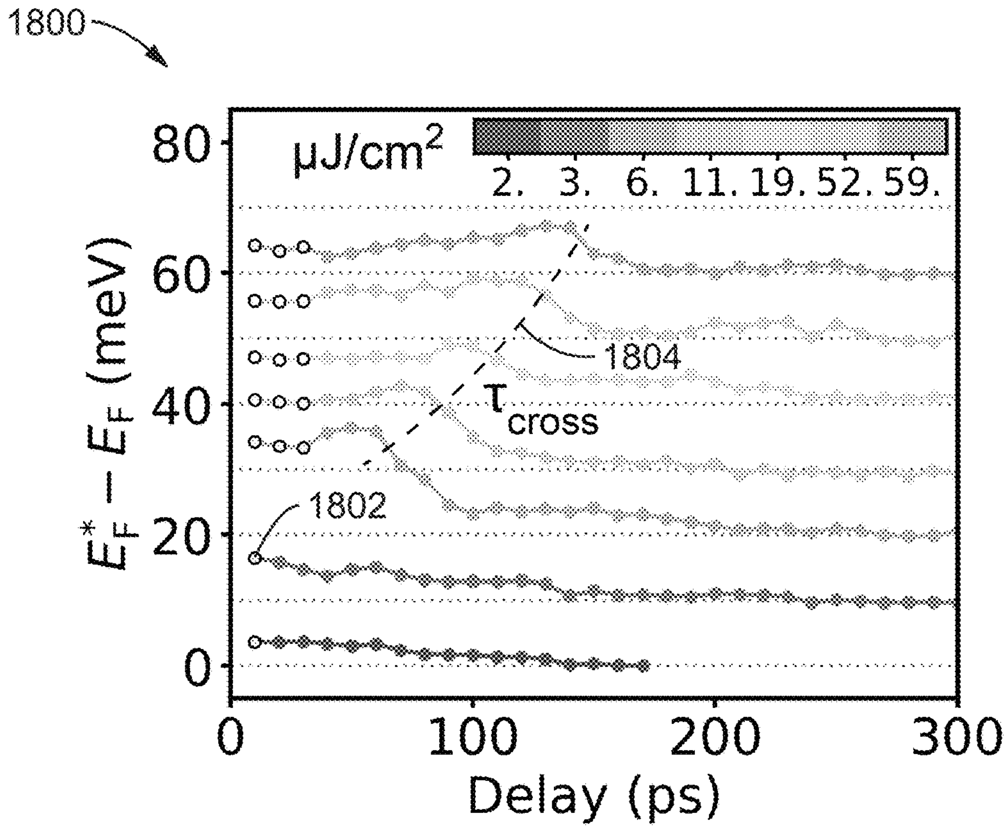
FIG. 18 is a graph of the quasi-Fermi level as a function of delay for all fluences. Outlined points indicate averaged points used in FIG. 22.

The delay dependence of $E_F$* for all measured fluences is plotted 1800 in FIG. 18. $E_F$* is measured in reference to the equilibrium Fermi level (i.e., the difference between the 604 and 602 from FIG. 6). For fluences above 4 μJ $cm^{-2}$, $E_F$* is offset from equilibrium starting in a plateau region for delays less than $\tau_{cross}$ preceding a small peak after $\tau_{cross}$ that leads into exponential decay. Curiously, the offset at early delays is non-monotonic with fluence, peaking at ~15 meV for 5.7 μJ $cm^{-2}$ and leveling off towards ~5 meV at high fluence. The open circled points 1802 indicate the values that are averaged to generate the $E_F$* offset values in FIG. 22. The hump that occurs near $\tau_{cross}$ 1804, may be indicative of a large charge transfer from QW2 to the TSS following the reverse Lifshitz transition of the QW2 singularity. This may additionally suggest that the sustained $E_F$* plateau region is also from charge in the QW states leaking into the TSS during relaxation. For the purposes of this disclosure the focus is on $E_F$* at early delays. The relatively small offset of $E_F$* contrasts with previous time-resolved studies on p-type $Bi_2Se_3$-related samples without quantum wells, emphasizing the influence of QW1 and QW2 on the relaxation dynamics.

The behavior of $E_F$* at early delays with respect to pump fluence can be explained within the framework of the stored equilibrium charge in QW1 and QW2 described in FIG. 10 through FIG. 13.

Figure 19:
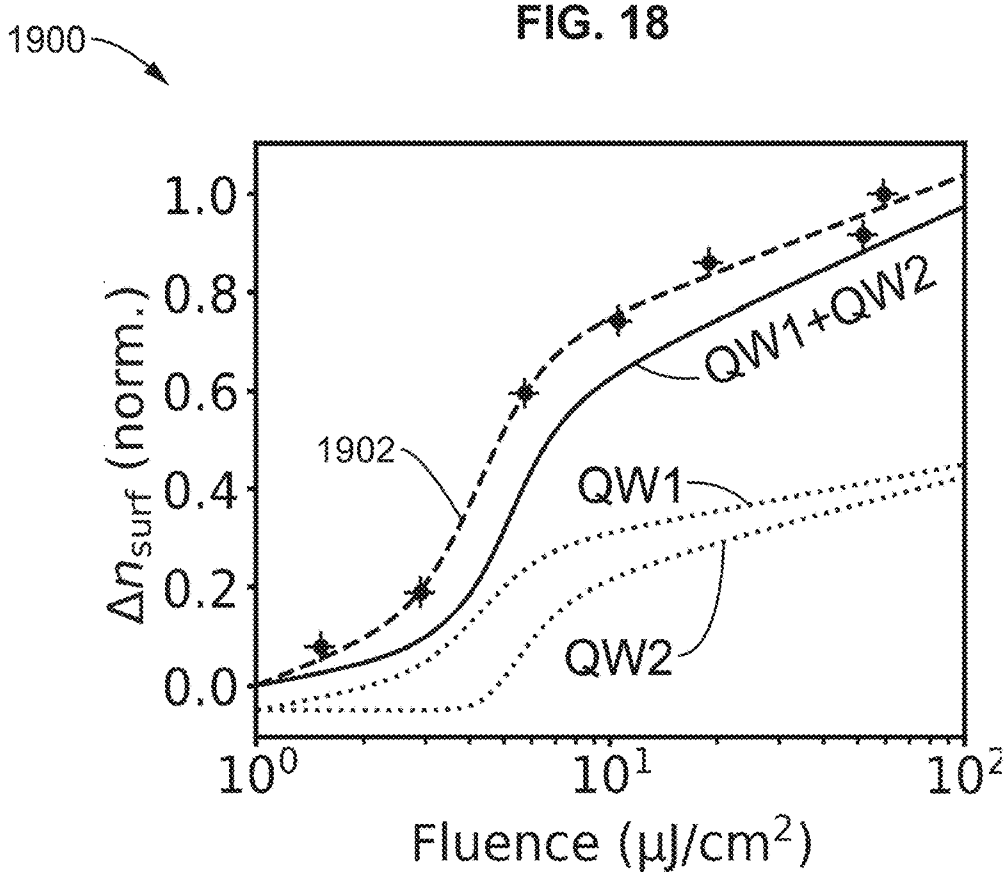
FIG. 19 is a graph of maximal SPV as a function of fluence indicating separated charge concentration at the surface. The QW1 and QW2 curves demonstrate states below $E_F$ determined from the phenomenological fit (dashed topmost curve) and the SPV dependence of the band bottom positions in FIG. 10.

In FIG. 19, the fluence dependence of the maximal

SPV, $|\Delta V_{SPV}(\tau=10\text{ ps})|$ is displayed, which is proportional to the initial net charge at the surface after hot carrier relaxation, $\Delta n_{surf}=n_{sep}$. Next, the fraction of charge stored below $E_F$ in QW1 and QW2 is calculated. To do this, linear extrapolations are used of the QW1 and QW2 band bottom positions as a function of SPV from the high fluence data in FIG. 10 and the cumulative DOS of Rashba-split parabolic bands. The band bottom positions, and therefore the cumulative DOS, are functions of the SPV strength and are calculated from the phenomenological fit of the SPV maximal values 1902. The sum of the QW1 and QW2 cumulative DOS corresponds to the total available quasi-equilibrium charge states for photoexcited charge (solid blue curve).

Figure 20A:
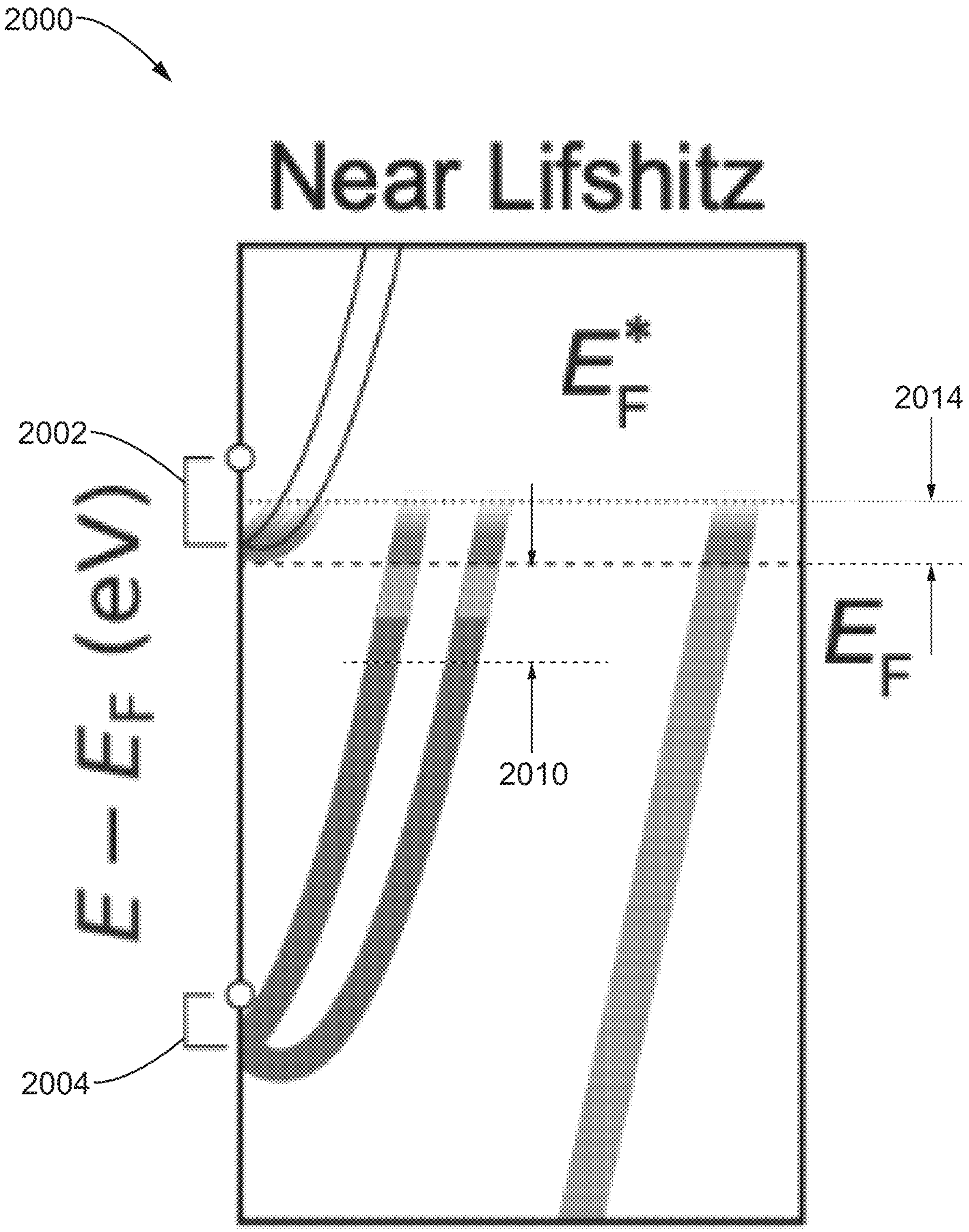
FIG. 20A and FIG. 20B are two graphical comparison of quasi-Fermi level shift between medium (FIG. 20A) and high (FIG. 20B) fluences. Medium fluence (3 to 7 μJ cm$^{-2}$), QW2 photo-carrier generation is significantly larger than available states in shifted QWs. At high fluence, photo-carrier generation has saturated and QW2 provides increased storage below $E_F$.
Figure 20B:
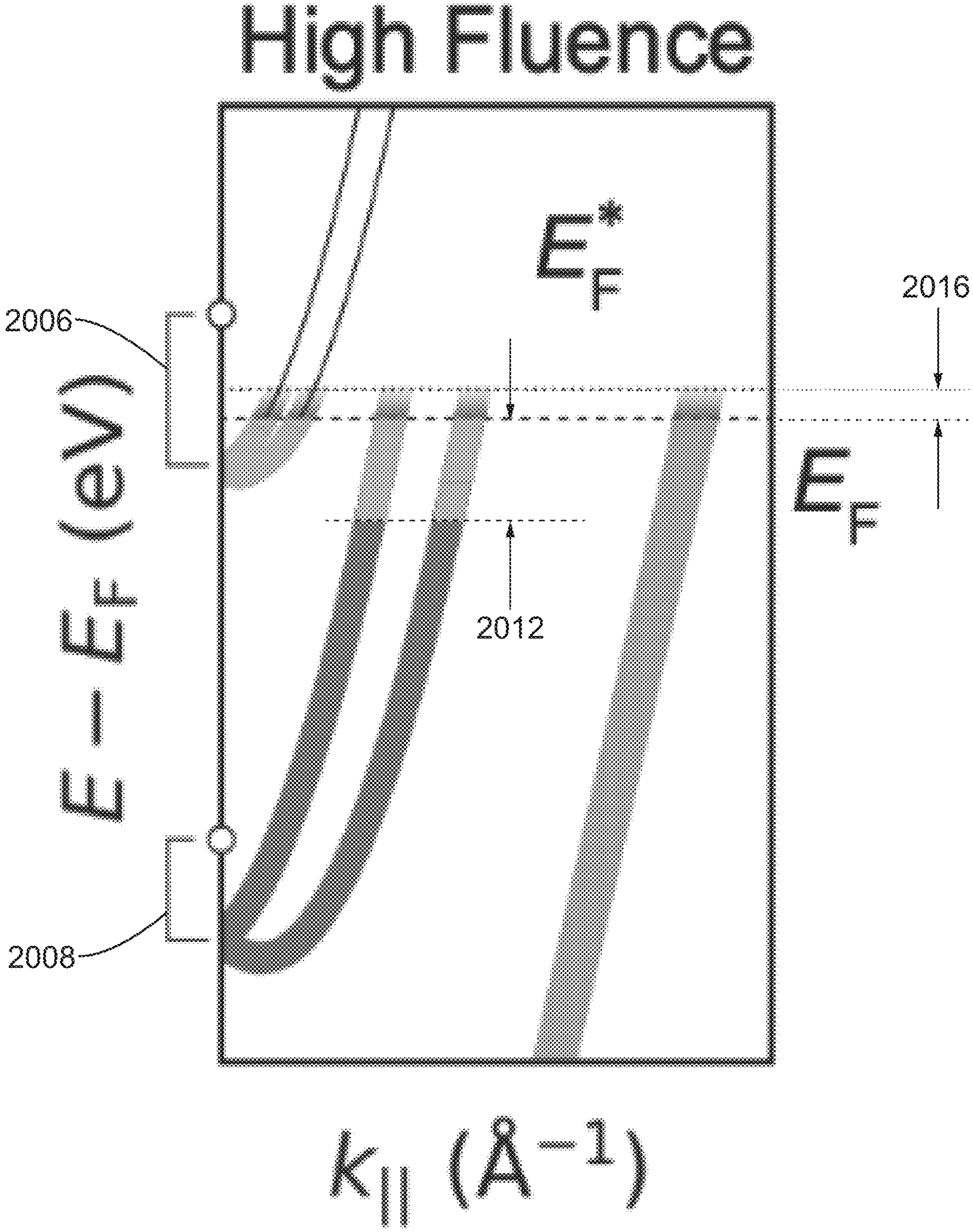

FIG. 20A and FIG. 20B depict two photoexcitation regimes that summarize the role of the Lifshitz transition on $E_F$*. The brackets 2002, 2004, 2006, and 2008 on the left indicate the pump induced quantum well energy shift from equilibrium positions, the regions 2010, 2012 and regions 2014, 2016 correspond to excited charge below and above $E_F$, respectively. At moderate fluences of 3 to 7 μJ $cm^{-2}$ QW2 undergoes a Lifshitz transition, however only QW1 has significant available states below $E_F$ leaving excess separated charge to populate above $E_F$. At high fluence, QW2 has shifted well below $E_F$ enabling a large degree of quasi-equilibrium charge storage reducing the burden on states above $E_F$.

To further quantify the effect, it is more useful to reparameterize the curves of FIG. 19 in terms of the surface voltage to avoid reliance on the SPV phenomenological fit. In this way, the total net charge concentration is a linear function and the QW1 and QW2 band bottoms are linearly dependent on the x-axis. Because the QW1 and QW2 band bottom positions are empirically determined, the only consequential free parameter is the relative amplitude of the total available quasi-equilibrium charge states (regions 2012, 2012) with respect to $n_{surf}$ (dashed black line 2102). The difference between the aforementioned populations represents the excess photoexcited charge at the surface (regions 2014, 2016), which describes the charge remaining after QW1 and QW2 are filled below $E_F$ and that must occupy above-$E_F$ states.

Figure 21:
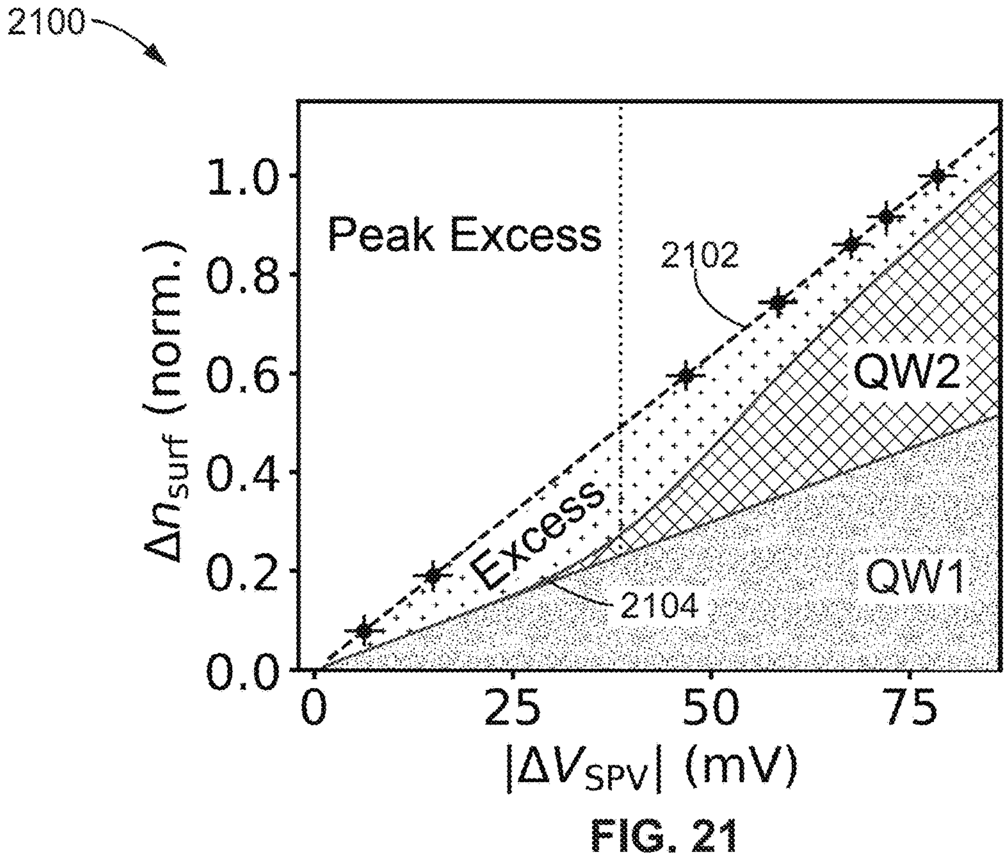
FIG. 21 is a graphical representation of FIG. 19 with the x-axis parameterized by SPV surface potential. Excess carriers after filling QW trap states (in the Excess region) contribute to raising $E_F$*.

From FIG. 21 is a graph 2100 of the emergence of the QW2 band bottom below $E_F$ 2104, which acts to enhance the DOS contribution of QW2 below $E_F$, necessitates a peaked behavior in the excess charge population near the Lifshitz transition, regardless of the dependence of the SPV effect.

Figure 22:
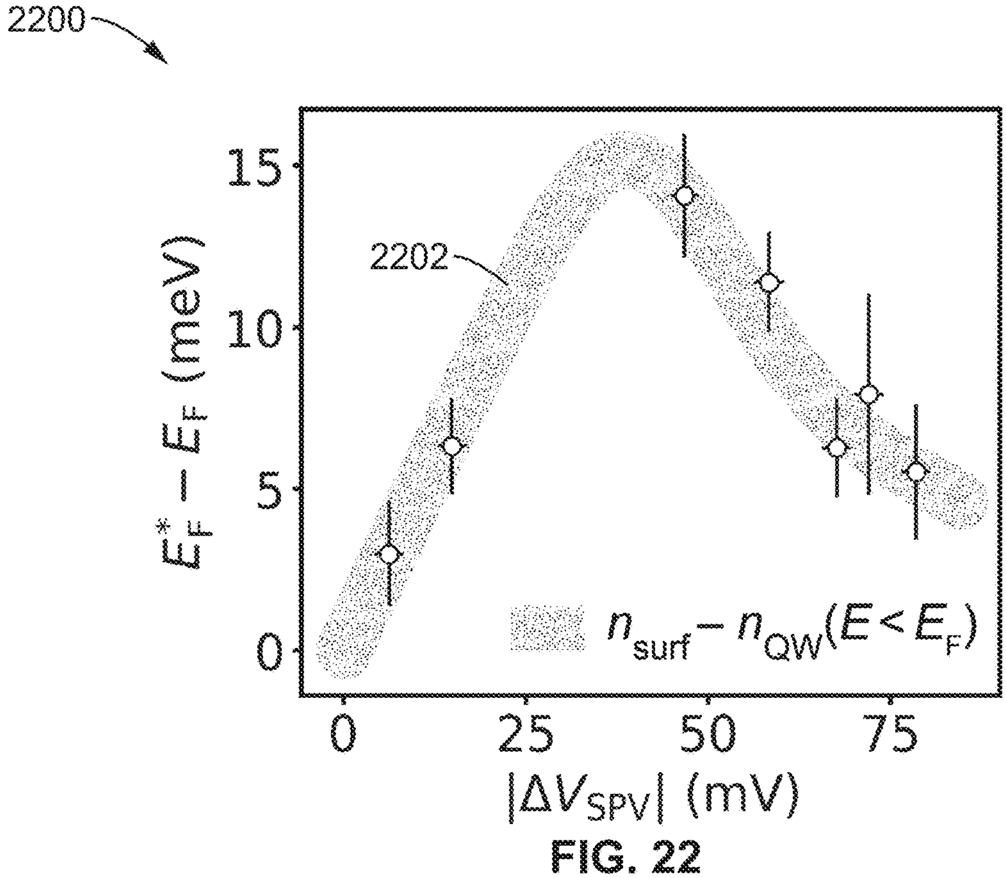
FIG. 22 is a graph of $E_F$* at short delays from FIG. 18 and total surface charge minus trapped surface charge 2202 (black dashed curve minus QW1 bounded area) in FIG. 21 as a function of surface voltage. Error bars for Δn and $\Delta V_{SPV}$ are conservative 10% and 2.5 meV, respectively. Y-axis error in FIG. 22 determined by difference between $E_F$* measured at QW1 and TSS $k_F$.

The proportionality factor between the charge stored in QW1 and QW2 with respect to $n_{surf}$ is chosen such that the excess charge best fits the $E_F$* offset plotted 2200 in FIG. 22. The excess charge from the model in FIG. 21 closely captures the non-monotonic behavior in the measured $E_F$* values.

6. Discussion

Using the reported dielectric constant of $Bi_2Se_3$ of a nominal $\varepsilon_r \approx 30-100$, one can extract an approximate SCR width, describing the spatial extent of the band-bending utilized in FIG. 2, $d=(2\,\Delta V_{BB,0}\,\varepsilon_r\varepsilon_0/e\,n_A)^{1/2}\approx 10$ nm, where the acceptor ion concentration, $n_A$, is approximately equal to the bulk majority carrier density in the space charge region (SCR) and $V_{BB,0}$~300 mV based on the observation of the QW3 energy level at short delay and the zero-point energy of the quantum well spectrum. A second independent method is to use charge conservation at the SPV saturation, since band-bending cancellation occurs when the total surface charge is equal to the volumetric bulk charge times the depth. The maximal surface charge can be calculated by Luttinger's theorem on the QW1, QW2, and TSS bands giving $5\times10^{12}$ $cm^{-2}$, and since only approximately ¼ (from $\Delta V_{SPV}/V_{BB,0}$) of the charge is screened in the SCR one gets, $d=5\times10^{12}\ cm^{-2}/(1\times10^{19}\ cm^{-3}/4)\sim 10$ nm. These estimates ignore possible variations in both the dopant concentration and dielectric constant between surface and bulk, as well as hexagonal deformation and possible non-isotropic charge storage at the Fermi surface. However, the approximate SCR width is consistent with the band-bending length-scale observed previously in $Bi_2Se_3$.

Initial reports of the Rashba effect on metallic surfaces suggested that applied fields on the order of 1000 mV $nm^{-1}$ are insufficient to produce the observed Rashba effect, and that the nuclear core potentials are responsible for large splittings. In the experiment here, it was observed that there was only a 15% reduction on an approximately 1 eV Å Rashba effect with fields near 10 mV $nm^{-1}$. There is a large body of evidence demonstrating small changes to surface or interface fields generate large changes to the Rashba parameter. A reasonable explanation that has been presented is that the applied field plays an indirect role on the Rashba effect by shifting electrons to and from the nuclear cores at the surface plane. With respect to $Bi_2Se_3$, researchers have debated the origin of the quantum wells from surface modulated van der Waal's gaps. Although the origin of the quantum wells has been further argued to be from surface band-bending, studies indirectly demonstrate the role of wavefunction overlap with the surface-most quintuple layer as a key ingredient to the Rashba effect. It has been shown through a simplified band-bending calculation of the QW wavefunctions that the shift in QW position is field-linear and nearly 2 Å over 10 mV $nm^{-1}$, a significant fraction of the quintuple layer thickness. In totality, these results are consistent with a picture that the origin of the Rashba splitting is largely controlled by wavefunction overlap with asymmetric nuclear potentials within the first quintuple layer, controlled linearly by the field.

One consequence of the ultrafast quantum well modification is a large rapid and reversible change in the DOS at the Fermi level. This is made possible by the emergence of QW2 below $E_F$ after pump excitation, changing the topology of the Fermi surface and triggering a reversible Lifshitz transition. The kink in the relaxation of the SPV as well as the Rashba modification is correlated with $\tau_{cross}$, indicating that the reversal of the Lifshitz transition plays a key role in the relaxation. Furthermore, the new states near the Fermi level imply an increase in conductivity at the surface affecting spin-dependent transport properties, and occupation of the QW2 band bottom would influence intersubband optical absorption. As such, this ultrafast field effect device provides many opportunities for applications which are sensitive to the DOS at the chemical potential and requires further attention exploring the DOS-dependent scattering dynamics.

The SPV photo-gating method can be extended to other semiconductor systems with 2D electron gases. In fact, a similar gating method to the one presented here has been utilized successfully in black phosphorus to drive gap renormalization at the surface. An example future application is a heterojunction system in which an exfoliated or MBE grown 2D material is placed on top of an SPV substrate separated by a thin insulating layer. In this case, a pump pulse focused on the grounded top layer would result in transient gating of the illuminated surface region. Moreover, SPV time constants can vary significantly from picoseconds to milliseconds depending on the system allowing for a large dynamic range of study.

In conclusion, complex quantum well dynamics using a time-resolved SPV-based gate have been described. The phenomenology of the photo-induced quantum well modification is general for surface quantum well systems because it relies on the surface band-bending of not only topological insulators but many semiconducting systems. For this system, the unique decay profile of both the SPV and Rashba reduction is contingent on the dynamic DOS near the Fermi level and the existence of a van Hove singularity in the Rashba-split quantum wells. Accordingly, local control of the near-$E_F$ DOS has been demonstrated; a useful tool for driving electronic phases such as superconductivity, magnetism, and, more broadly, correlated phases.

Furthermore, the ultrafast gating mechanism also revealed dynamically stored charge in QW1 and QW2 that ultimately controls the resulting quasi-Fermi level, impossible to observe using static gating techniques. Lastly, it was demonstrated ultrafast reversible modulation of the Rashba effect on 10 to 100 picosecond timescales creating the possibility for GHz spin-current manipulation. The temporary photo-induced Rashba tuning creates a platform for spin-orbit modulation enabling light-driven spintronic devices such as ultrafast spin-transistors and photo-controlled Rashba circuitry.

C. Methods

1. Sample Synthesis and Preparation

The p-type $Bi_2Se_3$ single crystals were grown via directional slow solidi cation with ~1 atomic % Mg substitution with bismuth to bring $E_F$ close to the bulk valence band maximum. The crystals were coated in graphite spray then cleaved in vacuum along the (111) plane at a base pressure of $5\times10^{-11}$ Torr. The sample experienced a rapid dosing triggered by initial exposure to the infrared pump resulting in the formation of a clear quantum well spectrum with no further dosing occurring after subsequent pumping. This dosing is perhaps due to the presence of trapped gasses in the graphite spray or the crystal itself, and produced results similar to the effects of carbon-monoxide and water surface dosing. This dosing effect has been observed multiple times but only after using graphite spray on specifically p-type $Bi_2Se_3$ samples.

2. Measurement Details

For the pump-probe measurement we used a pump of 1.48 eV p-polarized photons generated by a cavity-dumped Ti:sapphire oscillator operating with repetition rates of 1357.50 kHz (51.8 μJ $cm^{-2}$) and 678.75 kHz (all other fluences). The probe beam consisted of 5.94 eV p-polarized photons generated by frequency quadrupling of the 1.48 eV source in two BBO stages. The total time resolution from the two beams is 300 fs. The pump and probe beam spot full-width-half-maxima were 120 μm and 30 μm, respectively. The delay between the pump and the probe is achieved with a mechanical translation stage. Due to the long delay range, careful consideration was taken to ensure that the maximum pointing drift due to the delay stage was minimized to <15 μm. A variable neutral density filter applied to the pump beam enabled the fluence-dependent measurements. All reported fluence values indicate incident fluence on the $Bi_2Se_3$ surface. All spectra were taken at the system's base temperature with liquid nitrogen of ~80 K. Data were analyzed using PyARPES analysis framework.

D. Example Device and System

Figure 23:
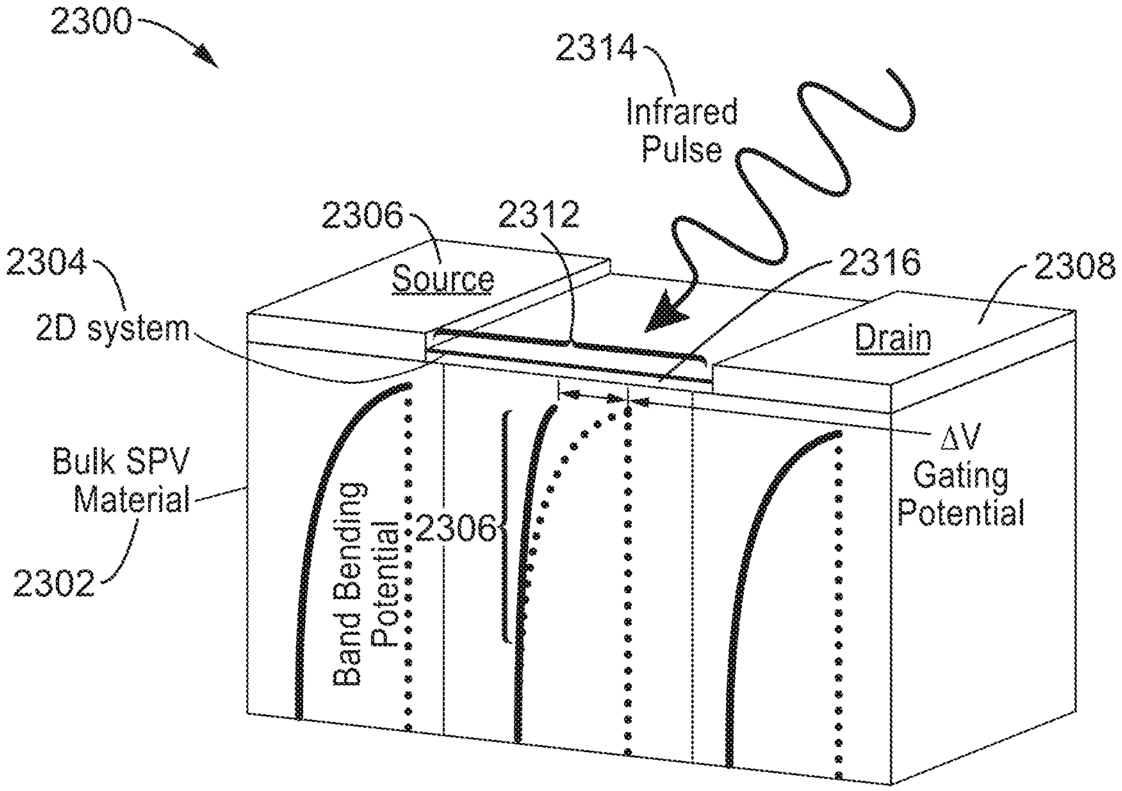
FIG. 23 is a schematic diagram of a device and system for light-driven ultrafast electric gating according to an embodiment of the technology of this disclosure.

FIG. 23 schematically illustrates one embodiment 2300 of a device and system for light-driven ultrafast electric gating according to aspects of the technology discussed above.

In the embodiment shown, the device comprises a bulk SPV material 2302 (such as silicon, GaAs, $Bi_2Se_3$, $Bi_2Te_3$, etc.) with a two-dimensional material 2304 on the surface that forms a surface electronic system (such as surface quantum well states, exfoliated 2D materials such as graphene, transition-metal-dichalcogenide, phosphene etc., deposited surface atoms, molecules, etc.). Thickness of the two-dimensional material region is anywhere from one atom to approximately 10 nm thick. The bulk SPV material 2302 layer is thicker than the band bending region 2306, typically greater than approximately 10 nm. Bulk SPV material 2302 is chemically doped such that the bulk is insulating (intrinsic doping). Metallic source 2306 and drain 2308 electrodes are lithographically deposited on the surface 2310 with an exposed region 2312 for infrared 2314 illumination and may be spaced apart within the illuminated region or towards the illuminated region edge and spaced apart by approximately 10 nm or greater.

The two-dimensional material is referred to as such because it has a thickness that is much less than its other dimensions, e.g., width or length. Embodiments of such two-dimensional material may comprise a crystalline solid selected from a group consisting of: a single layer of atoms, a single molecular layer, one or more layers of atoms approximately 1 Å to approximately 10 nm thickness, one or more single molecular layers totaling approximately 1 Å to approximately 10 nm thickness, one or more molecular layers totaling approximately 1 Å to approximately 10 nm thickness, and a thin multilayered material of approximately 1 to approximately 5 monolayers thickness.

A further embodiment of such two-dimensional material may comprise a crystalline solid selected from a group consisting of: a layer of two or more atoms, a molecular layer of two or more molecules, one or more layers of atoms approximately 1 nm to approximately 10 nm thickness, one or more single molecular layers totaling approximately 1 nm to approximately 10 nm thickness, one or more molecular layers totaling approximately 1 Å to approximately 10 nm thickness, and a thin multilayered material of approximately 2 to approximately 4 monolayers thickness.

Pulsed infrared 2314 light generated from an ultrafast laser source or otherwise is focused on the exposed surface region 2312 between the source 2306 and drain 2308 electrodes. Such infrared 2314 source may broadly illuminate the region far beyond the surface region 2312. The infrared 2314 light source produces sub-picosecond pulses between 10-10000 kHz, depending on the lifetime of the SPV effect (10 picoseonds to microseconds). The shape of the beam spot can be tailored to generate arbitrary illuminated geometries. The infrared 2314 light generates electron and hole free carriers that reduce the band bending 2306 in the bulk SPV material 2302 generating an SPV effect, thereby altering the surface potential in the exposed region.

The amplitude of the maximal gating potential is determined by the band bending potential and can be tuned by bulk doping to >200 meV in many semiconductors. The altered surface potential gates the 2D system 2304 of interest in the illuminated region affecting the electronic properties accordingly, affecting electronic transport from source 2306 to drain 2308.

The electronic transport from source 2306 to drain 2308 may produce a current flowing from the source 2306 to the drain 2308, which is modified by a gate-dependent property of the 2D material (e.g., magnitude or spin-polarization) when the surface region 2312 between the source 2306 and drain 2308 is illuminated by the ultrafast infrared 2314 pulse and subsequent surface photovoltage decay time.

Modification of the surface region 2312, which functions as a gate when illuminated by the infrared 2314 pulse, is reversibly restored after the surface region 2312 is illuminated by the ultrafast infrared 2314 pulse and the surface photovoltage has decayed.

Switching on of the modification of the gate-dependent property of the surface region 2312 and switching off occurs at timescales of less than about 200 picoseconds.

The material of the 2D electronic system 2304 2D material may be selected from a group consisting of: graphene, and a transition metal dichalcogenide (TMD).

An insulating buffer layer 2316 may additionally be disposed on the surface of the bulk SPV material 2302, wherein the two dimensional system 2304 is disposed on the insulating buffer layer beneath either the source 2306 and drain 2308, or both. Such insulating buffer layer 2316 is not necessary, but could be used to more clearly isolate the 2D system 2304 from the bulk SPV material 2302.

The insulating buffer layer 2316 may comprise a material selected from a group of material comprising: hexagonal boron nitride (hBN), and a thin-film high-k dielectric (e.g., strontium titanate ($SrTiO_3$)).

A 2D electronic state can be formed on the bulk SPV material 2302 itself depending on the exact physics of the bulk SPV material 2302. For instance, in quasi-2D systems, the van der Waals effect can more easily lead to quantization at the surface.

The infrared pulse 2314 may be a coherent light source such as a laser or a focused sub-picosecond near-infrared laser.

E. Conclusion

Quantum well (QW) states in semiconductors are a result of a confining potential that traps electrons (typically in a 2D plane) quantizing their electronic states. These states are easy to produce, have tunable band gaps, and are conceptually simple in terms of quantum systems. For these reasons, they have yielded a plethora of applications such as high-efficiency solar cells, infrared lasers, and qubits. Suitable confinement potentials can be achieved by constructing a multilayer heterostructure, but they can also occur spontaneously on surfaces from an adsorbate induced localized surface potential. When these states appear on the surface, the breaking of inversion symmetry removes the spin-degeneracy resulting in spin-polarized quantum well states. Combining quantum confinement with strong spin-orbit coupling joins the malleable electronic dispersions of quantum well states with the robust spin-polarization of Rashba states, making them extremely promising candidates for spin-based devices, such as the Datta Das spin-transistor.

Since the Rashba interaction and quantum well spectrum are both predicated on the underlying electric potential, tuning of the surface potential becomes a powerful method to manipulate both their spin and energy degrees of freedom. Such control has been achieved via in-situ surface chemical doping (irreversible and difficult to implement in devices) and electrostatic gating (ideal for devices but often limited by the magnitude of the quantum well potential at the surface of bulk samples, $10^7$-$10^{13}$ V $m^{-1}$). The real downfall of both methods is in the difficulty to dynamically tune the quantum well states on ultrafast timescales, restricting the ability to study the fundamental mechanisms of electronic relaxation and limiting device application in the time-domain.

Here, by combining the Surface Photovoltage Effect (SPV), a well-studied mechanism for producing reversible surface potentials in many semiconductors, with time and angle resolved photoemission spectroscopy (trARPES), an ultrafast and reversible control of Rashba splitting and energy level spacing was demonstrated, and a subsequent quasi-equilibrium charge storage in correspondence with a photoinduced Lifshitz transition. This is in contrast to proposed methods of spin-current manipulation in topological insulators using the SPV to solely change the local surface potential of the Dirac surface state. These results present an all-in-one approach for light-driven spin-orbit modulation and charge manipulation by directly controlling the density of states (DOS) on a picosecond timescale. Experiments were performed on p-type $Bi_2Se_3$, a promising candidate for spin-based devices, and ideal since it exhibits both a strong SPV effect in the bulk and 2D quantum well Rashba surface states, with the latter readily produced through various surface dopants such as carbon-monoxide, water, potassium, rubidium, or even long exposure to vacuum.

From the description herein, it will be appreciated that the present disclosure encompasses multiple implementations of the technology which include, but are not limited to, the following:

A device comprising: a semiconductor, the semiconductor exhibiting a surface photovoltage effect; a two-dimensional material (i.e., a crystalline solid of a single-layer of atoms) disposed over a surface of the semiconductor; and a drain electrode disposed on the two-dimensional material and a source electrode disposed on the two-dimensional material, an area between the drain electrode and the source electrode to be illuminated by an ultrafast infrared pulse.

The device of any preceding for following implementation, wherein when the device is in operation, current flowing from the source electrode to the drain electrode is modified by a gate-dependent property of the two dimensional material (e.g., magnitude or spin-polarization) when the area is illuminated by the ultrafast infrared pulse and subsequent surface photovoltage decay time afterward.

The device of any preceding or following implementation, wherein when the device is in operation, the modification by the gate dependent property of the two-dimensional material is reversibly restored after the area is illuminated by the ultrafast infrared pulse and the surface photovoltage has decayed.

The device of any preceding or following implementation, wherein when the device is in operation, switching of the modification of the gate-dependent property and back occurs at timescales of less than about 200 picoseconds.

The device of any preceding or following implementation, wherein the semiconductor is a semiconductor from the group of bismuth selenide ($Bi_2Se_3$), gallium arsenide (GaAs), and silicon.

The device of any preceding or following implementation, wherein the two-dimensional material is a two-dimensional material from the group of graphene and a transition metal dichalcogenide (TMD).

The device of any preceding or following implementation, further comprising: an insulating buffer layer disposed on the surface of the semiconductor, wherein the two dimensional material is disposed on the insulating buffer layer.

The device of any preceding for following implementation, wherein the insulating buffer layer is a material from the group of hexagonal boron nitride (hBN) and a thin-film high-k dielectric (e.g., strontium titanate ($SrTiO_3$)).

A device comprising: a semiconductor, the semiconductor exhibiting a surf ace photovoltage effect, a two dimensional electronic system being formed at a surface of the bulk material (i.e., a two dimensional electron gas); and a drain electrode disposed on the surface of the semiconductor and a source electrode disposed on the surface of the semiconductor, an area between the drain electrode and the source electrode to be illuminated by an ultrafast infrared pulse.

The device of any preceding or following implementation, wherein when the device is in operation, current flowing from the source electrode to the drain electrode is modified by a gate-dependent property of the two dimensional electronic system (e.g., magnitude or spin-polarization) when the area is illuminated by an ultrafast infrared pulse and subsequent surface photovoltage decay time afterward.

The device of any preceding or following implementation, wherein when the device is in operation, the modification by the gate dependent property of the two-dimensional electronic system is reversibly restored after the area is illuminated by the ultrafast infrared pulse and the surface photovoltage has decayed.

The device of any preceding or following implementation, wherein when the device is in operation, switching of the modification of the gate-dependent property and back occurs at timescales of less than about 200 picoseconds.

The device of any preceding or following implementation, wherein the semiconductor is a semiconductor from the group of bismuth selenide ($Bi_2Se_3$), gallium arsenide (GaAs), and silicon.

A system comprising: the device of any preceding or following implementation; and a coherent light source.

The system of any preceding or following implementation, wherein the coherent light source comprises a laser.

The system of any preceding or following implementation, wherein the coherent light source comprises a focused ultrafast (i.e., sub-picosecond) near-infrared pulsed laser.

A device comprising: a semiconductor, the semiconductor exhibiting a surface photovoltage effect; a two-dimensional material disposed over a surface of the semiconductor; a drain electrode disposed on the two-dimensional material and a source electrode disposed on the two-dimensional material; and an area between the drain electrode and the source electrode to be illuminated by an ultrafast infrared pulse.

The device of any preceding or following implementation, wherein the two-dimensional material comprises a crystalline solid selected from a group consisting of: a single layer of atoms, a single molecular layer, one or more layers of atoms ranging from approximately 1 Å to approximately 10 nm thickness, one or more single molecular layers totaling approximately 1 Å to approximately 10 nm thickness, one or more molecular layers totaling approximately 1 Å to approximately 10 nm thickness, and a thin multilayered material of approximately 1 to approximately 5 monolayers thickness.

The device of any preceding or following implementation, wherein when the device is in operation, current flowing from the source electrode to the drain electrode is modified by a gate dependent property of the two-dimensional material when the area is illuminated by the ultrafast infrared pulse and subsequent surface photovoltage decay time afterward.

The device of any preceding or following implementation, wherein the gate dependent property is selected from a group of properties consisting of magnitude or spin polarization.

The device of any preceding or following implementation, wherein when the device is in operation, the modification by the gate dependent property of the two-dimensional material is reversibly restored after the area is illuminated by the ultrafast infrared pulse and the surface photovoltage has substantially decayed.

The device of any preceding or following implementation, wherein when the device is in operation, switching of the modification of the gate dependent property and back occurs at timescales of less than about 200 picoseconds.

The device of any preceding or following implementation, wherein the semiconductor is a semiconductor selected from a group consisting of: bismuth selenide ($Bi_2Se_3$), gallium arsenide (GaAs), and silicon.

The device of any preceding or following implementation, wherein the two-dimensional material is a two-dimensional material selected from a group consisting of: graphene, and a transition metal dichalcogenide (TMD).

The device of any preceding or following implementation, further comprising: an insulating buffer layer disposed on the surface of the semiconductor, wherein the two-dimensional material is disposed on the insulating buffer layer.

The device of any preceding or following implementation, wherein the insulating buffer layer is a material selected from group consisting of: hexagonal boron nitride (hBN), and a thin-film high-k dielectric (e.g., strontium titanate ($SrTiO_3$)).

The device of any preceding or following implementation, wherein the ultrafast infrared pulse is coherent.

The device of any preceding or following implementation, wherein the ultrafast infrared pulse is a laser.

The device of any preceding or following implementation, wherein the ultrafast infrared pulse is a focused ultrafast near-infrared pulsed laser having a full width at half maximum (FWHM) pulse of less than one picosecond.

A device comprising: a semiconductor, the semiconductor exhibiting a surface photovoltage effect, a two-dimensional electronic system being formed at a surface of the bulk material; a drain electrode disposed on the surface of the semiconductor and a source electrode disposed on the surface of the semiconductor; and an area between the drain electrode and the source electrode to be illuminated by an ultrafast infrared pulse.

The device of any preceding or following implementation, where the two-dimensional electronic system formed at the surface of the bulk material is that of a two-dimensional electron gas.

The device of any preceding or following implementation, wherein when the device is in operation, current flowing from the source electrode to the drain electrode is modified by a gate dependent property of the two-dimensional electronic system when the area is illuminated by an ultrafast infrared pulse and subsequent surface photovoltage decay time afterward.

The device of any preceding or following implementation, wherein the gate dependent property of the two-dimensional electronic system is selected from a group consisting of magnitude and spin-polarization.

The device of any preceding or following implementation, wherein when the device is in operation, the modification by the gate dependent property of the two-dimensional electronic system is reversibly restored after the area is illuminated by the ultrafast infrared pulse and the surface photovoltage has decayed.

The device of any preceding or following implementation, wherein when the device is in operation, switching of the modification of the gate-dependent property and back occurs at timescales of less than about 200 picoseconds.

The device of any preceding or following implementation, wherein the semiconductor is a semiconductor from the group of bismuth selenide ($Bi_2Se_3$), gallium arsenide (GaAs), and silicon.

A method for switching a device, comprising: providing a semiconductor, the semiconductor exhibiting a surface photovoltage effect; providing a two-dimensional material disposed over a surface of the semiconductor; providing a drain electrode disposed on the two-dimensional material, a source electrode disposed on the two-dimensional material, and an area between the drain electrode and the source electrode to be illuminated by an ultrafast infrared pulse; and illuminating the area between the drain electrode and the source electrode with an infrared source.

The method of any preceding or following implementation, wherein the two-dimensional material comprises a crystalline solid selected from a group consisting of: a single layer of atoms, a single molecular layer, one or more layers of atoms ranging from approximately 1 Å to approximately 10 nm thickness, one or more single molecular layers totaling approximately 1 Å to approximately 10 nm thickness, one or more molecular layers totaling approximately 1 Å to approximately 10 nm thickness, and a thin multilayered material of approximately 1 to approximately 5 monolayers thickness.

The method of any preceding or following implementation, wherein when the device is in operation, current flowing from the source electrode to the drain electrode is modified by a gate dependent property of the two-dimensional material when the area is illuminated by the ultrafast infrared pulse and subsequent surface photovoltage decay time afterward.

The method of any preceding or following implementation, wherein the gate dependent property is selected from a group of properties consisting of magnitude or spin polarization.

The method of any preceding or following implementation, wherein when the device is in operation, the modification by the gate dependent property of the two-dimensional material is reversibly restored after the area is illuminated by the ultrafast infrared pulse and the surface photovoltage has substantially decayed.

The method of any preceding or following implementation, wherein when the device is in operation, switching of the modification of the gate dependent property and back occurs at timescales of less than about 200 picoseconds.

The method of any preceding or following implementation, wherein the semiconductor is a semiconductor selected from a group consisting of: bismuth selenide ($Bi_2Se_3$), gallium arsenide (GaAs), and silicon.

The method of any preceding or following implementation, wherein the two-dimensional material is a two-dimensional material selected from a group consisting of: graphene, and a transition metal dichalcogenide (TMD).

The method of any preceding or following implementation, further comprising: an insulating buffer layer disposed on the surface of the semiconductor, wherein the two-dimensional material is disposed on the insulating buffer layer.

The method of any preceding or following implementation, wherein the insulating buffer layer is a material selected from group consisting of: hexagonal boron nitride (hBN), and a thin-film high-k dielectric (e.g., strontium titanate ($SrTiO_3$)).

The method of any preceding or following implementation, wherein the ultrafast infrared pulse is coherent.

The method of any preceding or following implementation, wherein the ultrafast infrared pulse is a laser.

The method of any preceding or following implementation, wherein the ultrafast infrared pulse is a focused ultrafast near-infrared pulsed laser having a full width at half maximum (FWHM) pulse of less than one picosecond.

A method for switching a device, comprising: providing a semiconductor, the semiconductor exhibiting a surface photovoltage effect, a two-dimensional electronic system being formed at a surface of the semiconductor; providing a drain electrode disposed on the surface of the semiconductor, a source electrode disposed on the surface of the semiconductor, and an area between the drain electrode and the source electrode to be illuminated by an infrared pulse; and illuminating the area between the drain electrode and the source electrode with the infrared pulse.

The method of any preceding or following implementation, wherein the two-dimensional electronic system comprises a crystalline solid selected from a group consisting of: a single layer of atoms, a single molecular layer, one or more layers of atoms ranging from approximately 1 Å to approximately 10 nm thickness, one or more single molecular layers totaling approximately 1 Å to approximately 10 nm thickness, one or more molecular layers totaling approximately 1 Å to approximately 10 nm thickness, and a thin multilayered material of approximately 1 to approximately 5 monolayers thickness.

The method of any preceding or following implementation, wherein when the device is in operation, current flowing from the source electrode to the drain electrode is modified by a gate dependent property of the two-dimensional electronic system when the area is illuminated by the ultrafast infrared pulse and subsequent surface photovoltage decay time afterward.

The method of any preceding or following implementation, wherein the gate dependent property is selected from a group of properties consisting of magnitude or spin polarization.

The method of any preceding or following implementation, wherein when the device is in operation, the modification by the gate dependent property of the two-dimensional electronic system is reversibly restored after the area is illuminated by the infrared pulse and the surface photovoltage has substantially decayed.

The method of any preceding or following implementation, wherein when the device is in operation, switching of the modification of the gate dependent property and back occurs at timescales of less than about 200 picoseconds.

The method of any preceding or following implementation, wherein the semiconductor is selected from a group of semiconductors consisting of: bismuth selenide ($Bi_2Se_3$), gallium arsenide (GaAs), and silicon.

The method of any preceding or following implementation, wherein the two-dimensional electronic system is a two-dimensional material selected from a group of materials consisting of: graphene, and a transition metal dichalcogenide (TMD).

The method of any preceding or following implementation, wherein the infrared source is coherent.

The method of any preceding or following implementation, wherein the infrared source is a laser.

The method of any preceding or following implementation, wherein the infrared source is a focused near-infrared pulsed laser having a full width at half maximum (FWHM) pulse of less than one picosecond.

As used herein, term "implementation" is intended to include, without limitation, embodiments, examples, or other forms of practicing the technology described herein.

As used herein, the singular terms "a," "an," and "the" may include plural referents unless the context clearly dictates otherwise. Reference to an object in the singular is not intended to mean "one and only one" unless explicitly so stated, but rather "one or more."

Phrasing constructs, such as "A, B and/or C", within the present disclosure describe where either A, B, or C can be present, or any combination of items A, B and C. Phrasing constructs indicating, such as "at least one of" followed by listing a group of elements, indicates that at least one of these group elements is present, which includes any possible combination of the listed elements as applicable.

References in this disclosure referring to "an embodiment", "at least one embodiment" or similar embodiment wording indicates that a particular feature, structure, or characteristic described in connection with a described embodiment is included in at least one embodiment of the present disclosure. Thus, these various embodiment phrases are not necessarily all referring to the same embodiment, or to a specific embodiment which differs from all the other embodiments being described. The embodiment phrasing should be construed to mean that the particular features, structures, or characteristics of a given embodiment may be combined in any suitable manner in one or more embodiments of the disclosed apparatus, system, or method.

As used herein, the term "set" refers to a collection of one or more objects. Thus, for example, a set of objects can include a single object or multiple objects.

Relational terms such as first and second, top and bottom, upper and lower, left and right, and the like may be used solely to distinguish one entity or action from another entity or action without necessarily requiring or implying any actual such relationship or order between such entities or actions.

The terms "comprises," "comprising," "has", "having," "includes", "including," "contains", "containing" or any other variation thereof, are intended to cover a non-exclusive inclusion, such that a process, method, article, or apparatus that comprises, has, includes, contains a list of elements does not include only those elements but may include other elements not expressly listed or inherent to such process, method, article, or apparatus. An element proceeded by "comprises . . . a", "has . . . a", "includes . . . a", "contains . . . a" does not, without more constraints, preclude the existence of additional identical elements in the process, method, article, or apparatus that comprises, has, includes, contains the element.

As used herein, the terms "approximately", "approximate", "substantially", "essentially", and "about", or any other version thereof, are used to describe and account for small variations. When used in conjunction with an event or circumstance, the terms can refer to instances in which the event or circumstance occurs precisely as well as instances in which the event or circumstance occurs to a close approximation. When used in conjunction with a numerical value, the terms can refer to a range of variation of less than or equal to ±10% of that numerical value, such as less than or equal to ±5%, less than or equal to ±4%, less than or equal to ±3%, less than or equal to ±2%, less than or equal to ±1%, less than or equal to ±0.5%, less than or equal to ±0.1%, or less than or equal to ±0.05%. For example, "substantially" aligned can refer to a range of angular variation of less than or equal to ±10°, such as less than or equal to ±5°, less than or equal to ±4°, less than or equal to ±3°, less than or equal to ±2°, less than or equal to ±1°, less than or equal to ±0.5°, less than or equal to ±0.1°, or less than or equal to ±0.05°.

Additionally, amounts, ratios, and other numerical values may sometimes be presented herein in a range format. It is to be understood that such range format is used for convenience and brevity and should be understood flexibly to include numerical values explicitly specified as limits of a range, but also to include all individual numerical values or sub-ranges encompassed within that range as if each numerical value and sub-range is explicitly specified. For example, a ratio in the range of about 1 to about 200 should be understood to include the explicitly recited limits of about 1 and about 200, but also to include individual ratios such as about 2, about 3, and about 4, and sub-ranges such as about 10 to about 50, about 20 to about 100, and so forth.

The term "coupled" as used herein is defined as connected, although not necessarily directly and not necessarily mechanically. A device or structure that is "configured" in a certain way is configured in at least that way, but may also be configured in ways that are not listed.

Benefits, advantages, solutions to problems, and any element(s) that may cause any benefit, advantage, or solution to occur or become more pronounced are not to be construed as a critical, required, or essential features or elements of the technology describes herein or any or all the claims.

In addition, in the foregoing disclosure various features may be grouped together in various embodiments for the purpose of streamlining the disclosure. This method of disclosure is not to be interpreted as reflecting an intention that the claimed embodiments require more features than are expressly recited in each claim. Inventive subject matter can lie in less than all features of a single disclosed embodiment.

The abstract of the disclosure is provided to allow the reader to quickly ascertain the nature of the technical disclosure. It is submitted with the understanding that it will not be used to interpret or limit the scope or meaning of the claims.

It will be appreciated that the practice of some jurisdictions may require deletion of one or more portions of the disclosure after that application is filed. Accordingly, the reader should consult the application as filed for the original content of the disclosure. Any deletion of content of the disclosure should not be construed as a disclaimer, forfeiture, or dedication to the public of any subject matter of the application as originally filed.

The following claims are hereby incorporated into the disclosure, with each claim standing on its own as a separately claimed subject matter.

Although the description herein contains many details, these should not be construed as limiting the scope of the disclosure but as merely providing illustrations of some of the presently preferred embodiments. Therefore, it will be appreciated that the scope of the disclosure fully encompasses other embodiments which may become obvious to those skilled in the art.

All structural and functional equivalents to the elements of the disclosed embodiments that are known to those of ordinary skill in the art are expressly incorporated herein by reference and are intended to be encompassed by the present claims. Furthermore, no element, component, or method step in the present disclosure is intended to be dedicated to the public regardless of whether the element, component, or method step is explicitly recited in the claims. No claim element herein is to be construed as a "means plus function" element unless the element is expressly recited using the phrase "means for". No claim element herein is to be construed as a "step plus function" element unless the element is expressly recited using the phrase "step for".

What is claimed is:

1. A device comprising:

a semiconductor, the semiconductor capable of exhibiting a surface photovoltage effect;

an insulating buffer layer disposed on the surface of the semiconductor;

a two-dimensional material disposed on the surface of the insulating buffer layer;

a drain electrode disposed on the two-dimensional material and a source electrode disposed on the two-dimensional material; and an area between the drain electrode and the source electrode configured to be illuminated by sub-picosecond infrared pulses from an infrared light source, wherein a current flowing from the source electrode to the drain electrode is modified by a gate dependent property of the two-dimensional material when the area is illuminated by the sub-picosecond infrared pulse and subsequent surface photovoltage decay time afterward.

2. The device of claim 1, wherein the two-dimensional material comprises a crystalline solid selected from a group consisting of: a single layer of atoms, a single molecular layer, one or more layers of atoms ranging from approximately 1 Å to approximately 10 nm thickness, one or more single molecular layers totaling approximately 1 Å to approximately 10 nm thickness, one or more molecular layers totaling approximately 1 Å to approximately 10 nm thickness, and a thin multilayered material of approximately 1 to approximately 5 monolayers thickness.

3. The device of claim 1, wherein the gate dependent property is selected from a group of properties consisting of magnitude and spin polarization.

4. The device of claim 1, wherein the modification by the gate dependent property of the two-dimensional material is reversibly restored after the area is illuminated by the sub-picosecond infrared pulse and the surface photovoltage has substantially decayed.

5. The device of claim 1, wherein switching of the modification of the gate dependent property and back occurs at timescales of less than about 200 picoseconds.

6. The device of claim 1, wherein the semiconductor is a semiconductor selected from a group consisting of: bismuth selenide ($Bi_2Se_3$), gallium arsenide (GaAs), and silicon.

7. The device of claim 1, wherein the two-dimensional material is a two-dimensional material selected from a group consisting of: graphene, and a transition metal dichalcogenide (TMD).

8. The device of claim 1, wherein the insulating buffer layer is a material selected from group consisting of: hexagonal boron nitride (hBN), a thin-film high-k dielectric, and a thin film strontium titanate ($SrTiO_3$) dielectric.

9. The device of claim 1, further comprising an infrared light source capable of producing sub-picosecond coherent infrared pulses.

10. The device of claim 9, wherein the infrared light source is an infrared laser.

11. The device of claim 10, wherein the infrared laser is a focused sub-picosecond near-infrared pulsed laser having a full width at half maximum (FWHM) pulse of less than one picosecond.

12. An apparatus comprising:

a focused sub-picosecond near-infrared pulsed laser having a full width at half maximum (FWHM) pulse of less than one picosecond capable of producing sub-picosecond infrared pulses;

a bulk semiconductor, the semiconductor exhibiting a surface photovoltage effect, a two-dimensional electronic system being formed at a surface of the bulk material;

a drain electrode disposed on the surface of the semiconductor and a source electrode disposed on the surface of the semiconductor; and an area between the drain electrode and the source electrode configured to be illuminated by sub-picosecond infrared pulses from the infrared laser, producing picosecond time-varying electric fields at the bulk material's surface, thereby reversibly modulating a quantum well spectrum and a Rashba effect.

13. The apparatus of claim 12, where the two-dimensional electronic system formed at the surface of the bulk material is that of a two-dimensional electron gas.

14. The apparatus of claim 12, wherein when the device is in operation, current flowing from the source electrode to the drain electrode is modified by a gate dependent property of the two-dimensional electronic system when the area is illuminated by a sub-picosecond infrared pulse and subsequent surface photovoltage decay time afterward.

15. The apparatus of claim 14, wherein the gate dependent property of the two-dimensional electronic system is selected from a group consisting of magnitude and spin-polarization.

16. The apparatus of claim 15, wherein the semiconductor is a semiconductor from the group of bismuth selenide ($Bi_2Se_3$), gallium arsenide (GaAs), and silicon.

17. The apparatus of claim 14, wherein when the device is in operation, the modification by the gate dependent property of the two-dimensional electronic system is reversibly restored after the area is illuminated by the sub-picosecond infrared pulse and the surface photovoltage has decayed.

18. The apparatus of claim 14, wherein switching of the modification of the gate-dependent property and back occurs at timescales of less than about 200 picoseconds.

* * * * *